US010255551B2

(12) United States Patent
Fick et al.

(10) Patent No.: US 10,255,551 B2
(45) Date of Patent: Apr. 9, 2019

(54) MIXED-SIGNAL CIRCUITRY FOR COMPUTING WEIGHTED SUM COMPUTATION

(71) Applicants: The Regents of The University of Michigan, Ann Arbor, MI (US); Mythic, Inc., Austin, TX (US)

(72) Inventors: David Alan Fick, Cedar Park, TX (US); Laura E. Fick, Cedar Park, TX (US); Skylar J. Skrzyniarz, Austin, TX (US); Manar El-Chammas, Austin, TX (US)

(73) Assignees: The Regents of The University of Michigan, Ann Arbor, MI (US); Mythic, Inc., Austin, TX (US)

( * ) Notice: Subject to any disclaimer, the term of this patent is extended or adjusted under 35 U.S.C. 154(b) by 0 days.

(21) Appl. No.: 15/890,402

(22) Filed: Feb. 7, 2018

(65) Prior Publication Data
US 2018/0247192 A1  Aug. 30, 2018

Related U.S. Application Data

(60) Provisional application No. 62/455,703, filed on Feb. 7, 2017.

(51) Int. Cl.
*G06N 3/063* (2006.01)
*H03K 5/24* (2006.01)
*G06N 3/08* (2006.01)
(52) U.S. Cl.
CPC ............. *G06N 3/08* (2013.01); *G06N 3/0635* (2013.01); *H03K 5/24* (2013.01)
(58) Field of Classification Search
CPC ........... G06N 3/08; G06N 3/0635; H03K 5/24
See application file for complete search history.

(56) References Cited

U.S. PATENT DOCUMENTS 5,039,870 A     8/1991  Engeler
5,155,377 A  * 10/1992  Castro .................. G06N 3/0635
                                                    327/427
(Continued)

FOREIGN PATENT DOCUMENTS

EP         0469885 A2    2/1992

OTHER PUBLICATIONS

Boser, Bernhard E., et al. "An analog neural network processor with programmable topology." IEEE Journal of Solid-State Circuits 26.12 (1991): 2017-2025. (Year: 1991).*

*Primary Examiner* — Eric Nilsson
(74) *Attorney, Agent, or Firm* — Harness, Dickey & Pierce, P.L.C.

(57) ABSTRACT

An integrated circuit and method are provided for performing weighted sum computations. The circuit includes: a plurality of current generators interconnected and arranged into pairs, a positive summation node, a negative summation node, and an input generation circuit. For each pair of current generators, the control terminal of each element is electrically connected to an input node. One of the current generators has its drain connected to the positive summation node while the other current generation element has its drain connected to the negative summation node. The remaining terminals on both current generators are connected to a reference, which may be shared. Each pair of current generator source predetermined amounts of current onto the two summation nodes when the following conditions occur: the input node is at an activation voltage, and the two summation nodes are at a predetermined target voltage.

19 Claims, 18 Drawing Sheets

(56) References Cited

U.S. PATENT DOCUMENTS

| | | | | |
|---|---|---|---|---|
| 5,479,578 A | * | 12/1995 | Engeler | G06N 3/063 |
| | | | | 706/34 |
| 5,630,024 A | * | 5/1997 | Aihara | G06N 3/0481 |
| | | | | 706/41 |
| 5,959,871 A | * | 9/1999 | Pierzchala | G06G 7/06 |
| | | | | 327/565 |
| 2016/0048755 A1 | | 2/2016 | Freyman et al. | |

* cited by examiner

Generating Input Signals S210

Generating Differential Current Signals S220

Summing Currents Along a Node S230

Sourcing Predetermined Differential Currents S240

Sourcing Common Current Signals S250

Identifying A Weighted Sum Difference S260

FIGURE 2

MIXED-SIGNAL CIRCUITRY FOR COMPUTING WEIGHTED SUM COMPUTATION

CROSS-REFERENCE TO RELATED APPLICATIONS

This application claims the benefit of U.S. Provisional Application No. 62/455,703, filed Feb. 7, 2017. The entire disclosure of the above application is incorporated herein by reference.

GOVERNMENT CLAUSE

This invention was made with government support under Contract No. FA8650-14-C-1805 awarded by the Air Force Research Laboratory. The Government has certain rights in this invention.

TECHNICAL FIELD

The disclosure herein relate generally to the integrated circuitry architecture field, and more specifically to new and useful mixed-signal integrated circuits and methods of mixed-signal computing in the integrated circuitry architecture field.

BACKGROUND

Today, the various implementations of artificial intelligence and machine learning are driving innovation in many fields of technology. Artificial intelligence (AI) systems and artificial intelligence models (including algorithms) are defined by many system architectures and models that enable machine learning (deep learning), reasoning, inferential capacities, and large data processing capabilities of a machine (e.g., a computer and/or a computing server). These AI systems and models are often trained intensively to perform one or more specific tasks, such as natural language processing, image recognition, planning, decision-making, and the like. For example, a subset of these AI systems and models include artificial neural network models. The training of an artificial neural network model may, in many cases, require thousands of hours across the training cycle and many terabytes of training data to fine tune associated neural network algorithm(s) of the model before use.

However, once trained, a neural network model or algorithm may be deployed quickly to make inferences to accomplish specific tasks (e.g., recognizing speech from speech input data, etc.) based on relatively smaller datasets when compared to the larger training datasets used during the training cycle. The inferences made by the neural network model or algorithm based on the smaller datasets may be a prediction about what the neural network model calculates to be a correct answer or indication about a circumstance.

Still, while neural network models implementing one or more neural network algorithms may not require a same amount of compute resources, as required in a training phase, deploying a neural network model in the field continues to require significant circuitry area, energy, and compute power to classify data and infer or predict a result. For example, weighted sum calculations are commonly used in pattern matching and machine learning applications, including neural network applications. In weighted sum calculations, an integrated circuit may function to multiply a set of inputs ($x_i$) by a set of weights ($w_i$) and sum the results of each multiplication operation to calculate a final result (z). Typical weighted sum calculations for a machine learning application, however, include hundreds or thousands of weights which causes the weighted sum calculations to be computationally expensive to compute with traditional digital circuitry. Specifically, accessing the hundreds or thousands of weights from a digital memory requires significant computing time (i.e., increased latency) and significant energy.

Accordingly, traditional digital circuitry required for computing weighted sum computations of a neural network model or the like tend to be large to accommodate a great amount of digital memory circuitry needed for storing the hundreds of thousands of weights required for the neural network model. Due to the large size of the circuitry, more energy is required to enable the compute power of the many traditional computers and circuits.

Additionally, these traditional computers and circuits for implementing artificial intelligence models and, namely, neural network models may be suitable for remote computing processes, such as in distributed computing systems (e.g., the cloud), or when using many onsite computing servers and the like. However, latency problems are manifest when these remote artificial intelligence processing systems are used in computing inferences and the like for remote, edge computing devices or in field devices. That is, when these traditional remote systems seek to implement a neural network model for generating inferences to be used in remote field devices, there are unavoidable delays in receiving input data from the remote field devices because the input data must often be transmitted over a network with varying bandwidth and subsequently, inferences generated by the remote computing system must be transmitted back to the remote field devices via a same or similar network.

Implementing AI processing systems at the field level (e.g., locally at the remote field device) may be a proposed solution to resolve some of the latency issues. However, attempts to implement some of these traditional AI computers and systems at an edge device (e.g. remote field device) may result in a bulky system with many circuits, as mentioned above, that consumes significant amounts of energy due to the required complex architecture of the computing system used in processing data and generating inferences. Thus, such a proposal without more may not be feasible and/or sustainable with current technology.

Accordingly, there is a need for a deployable system for implementing artificial intelligence models locally in the field (e.g., local AI), and preferably to be used in edge devices, that do not result in large, bulky (edge) devices, that reduces latency, and that have necessary compute power to make predictions or inferences, in real-time or substantially real-time, while also being energy efficient.

The below-described embodiments of the present application provide such advanced and improved integrated circuits and implementation techniques capable of addressing the deficiencies of traditional systems and integrated circuit architectures for implementing AI and machine learning.

SUMMARY

This section provides a general summary of the disclosure, and is not a comprehensive disclosure of its full scope or all of its features.

In one embodiment, a mixed-signal circuit for computing a weighted sum computation comprises: a plurality of programmable current sources arranged in pairs, a first programmable current source in each pair of programmable current sources is configured to store a value indicative of a positive weight and a second programmable current source in each pair of programmable current sources is configured to store a value indicative of a negative weight, each programmable current source has an input and an output terminal, such that output terminals of the first programmable current sources are electrically coupled together at a positive summation node and output terminals of the second programmable current sources are electrically coupled together at a negative summation node; a differential current circuit electrically coupled to the positive summation node and the negative summation node and operates to supply a current to each of the positive summation node and the negative summation node, where the current supplied to the positive summation node exhibits a difference with the current supplied to the negative summation node; and a controller interfaced with the differential current circuit and the comparison circuit, wherein the controller interacts with the differential current circuit to change magnitude of the difference between the current supplied to the positive summation node and the current supplied to the negative summation node.

In one embodiment, the controller of the mixed-signal circuit receives the signal output by the comparison circuit and, in response to the signal indicating that the voltages at the positive summation node and the negative summation node are equal, records the difference between the current supplied to the positive summation node and the current supplied to the negative summation node.

In one embodiment, the controller of the mixed-signal circuit interacts with the differential current circuit to sweep magnitude of the difference in a range of values, where the range of values is defined between a maximum negative value and a maximum positive value.

In one embodiment, the mixed-signal circuit further comprises a common-mode current circuit electrically coupled to the positive summation node and the negative summation node, wherein the common-mode current circuit determines an average of voltage at the positive summation node and the negative summation node and supplies a current to each of the positive summation node and the negative summation node, such that the average is maintained at a target voltage and magnitude of current supplied to the positive summation node and the negative summation node is equal.

In one embodiment, each programmable current of the mixed-signal circuit is further defined as one or more floating-gate transistors, such that a control terminal of the one or more floating-gate transistor is electrically coupled to the input circuit, a drain terminal of the one or more floating-gate transistors is electrically coupled to a respective summation node, and a source terminal of the one or more floating-gate transistors is electrically coupled to ground.

In one embodiment, each programmable current source is further defined as a memristor.

In one embodiment, the comparison circuit of the mixed-signal circuit includes an operational amplifier or a regenerative latch (or a regenerative amplifier).

In one embodiment, the mixed-signal circuit further comprises a resistor electrically coupled between the positive summation node and the negative summation node.

In one embodiment, an integrated circuit comprises: a plurality of paired current sources, wherein a first current source and a second current source of each of the plurality of paired current sources being arranged in electrical communication, wherein each of the first current source and the second current source comprises a drain terminal, and a source terminal; wherein each of the plurality of paired current sources includes a control terminal arranged in electrical communication with an input node; a pair of current summation nodes comprising a first current summation node and a second current summation node, wherein: the source terminal of each of the first current source and of the second current source of each of the plurality of paired current sources is connected to a ground, the drain terminal of the first current source of each of the plurality of paired current sources is arranged in electrical communication with the first current summation node and the drain terminal of the second current source of each of the plurality of paired current sources is arranged in electrical communication with the second current summation node; a differential current circuit comprising differential current controller and two differential current sources, wherein the differential current controller is in operable control communication with the two differential current sources, wherein each of the two differential current sources is arranged in electrical communication with one of the first current summation node and the second current summation node; a common-mode current circuit comprising a common-mode current controller and two common current sources, wherein the common-mode current controller is in operable control communication with the two common current sources, wherein each of the two common current sources is arranged in electrical communication with one of the first current summation node and the second current summation node; and a comparator circuit that is in electrical communication with a terminal end of the first current summation node and the second current summation node.

In one embodiment, the input node of the integrated circuit supplies a voltage input signal to the control terminal of each of the plurality of paired current sources, and in response to voltage input signal, each of the plurality of paired current sources generates two differential currents, wherein a value of a difference between the two differential currents generated by each of the plurality of paired current sources varies, and wherein each of the two differential currents of each of the plurality of paired current sources is sourced to one of the first summation node and the second summation node.

In one embodiment, the common-mode current circuit of the integrated circuit identifies an average voltage value of the first current summation node and the second current summation node, in response to identifying the average voltage value of the first current summation node and the second current summation node, the common-mode controller sets the average voltage value of the first current summation node and the second current summation node to a predetermined target voltage by generating two common current signals and sources a first common current signal and a second common current signal of the two common current signals to each of the first current summation node and the second current summation node, respectively, wherein a magnitude and a direction of the two common current signals are equal.

In one embodiment, the differential current controller of the integrated circuit causes the two differential current sources to generate two predetermined differential current signals having a same predetermined magnitude and opposite directions, the differential current circuit sources a first differential current and a second differential current of the two predetermined differential currents to the first current summation node and the second current summation node, respectively.

In one embodiment, the comparator circuit of the integrated circuit compares a total summed current sourced from the first current summation node and a total summed current sourced from the second current summation node; and the comparator circuit outputs an indicator when the total summed current sourced from the first current summation node and the total summed current sourced from the second current summation node are equal.

In one embodiment, the comparator circuit of the integrated circuit compares a total summed current sourced from the first current summation node and a total summed current sourced from the second current summation node by sensing voltages or summed currents of the first summation node and the second summation node; and the comparator circuit records values of the differential current signals sourced by the differential current circuit when the total summed current sourced from the first current summation node and the total summed current sourced from the second current summation node are equal.

In one embodiment, the integrated circuit converts the recorded values of the differential current signals sourced by the differential current circuit to a digital output.

In one embodiment, the first current source and the second current source of each of the plurality of paired current sources the integrated circuit comprise a programmable current generator that is preprogrammed with a predetermined weight of a machine learning model.

In one embodiment, the first summation node of the integrated circuit is configured to sum current signals having a positive weight (or positive coefficient) sourced from the first current source of each of the plurality of paired current sources; and the second summation node is configured to sum current signals having a negative weight (or negative coefficient) sourced from the second current source of each of the plurality of paired current sources.

In one embodiment, the differential current circuit of the integrated circuit sources a plurality of predetermined current signals to the first current summation node and the second current summation node based on a set of predetermined current signal values ranging from a most negative current value to a most positive current value.

In one embodiment, a method of using an integrated circuit, the method comprises: supplying a voltage input signal to a control terminal of each of a plurality of paired current sources; in response to the voltage input signal, generating at each of the plurality of paired current sources two differential currents, wherein a value of a difference between the two differential currents generated by each of the plurality of paired current sources varies, and wherein each of the two differential currents of each of the plurality of paired current sources is sourced to one of a first summation node and a second summation node; identifying an average voltage value of the first current summation node and the second current summation node; in response to identifying the average voltage value of the first current summation node and the second current summation node, setting the average voltage value of the first current summation node and the second current summation node to a predetermined target voltage by generating two common current signals and sources a first common current signal and a second common current signal of the two common current signals to each of the first current summation node and the second current summation node, respectively, wherein a magnitude and a direction of the two common current signals are equal; generating two predetermined differential current signals having a same magnitude and opposite directions; sourcing a first differential current and a second differential current of the two predetermined differential currents to the first current summation node and the second current summation node, respectively; comparing a total summed current sourced from the first current summation node and a total summed current sourced from the second current summation node; and outputting an indicator when the total summed current sourced from the first current summation node and the total summed current sourced from the second current summation node are equal.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2 illustrates a method for performing a weighted sum computation using an integrated circuit in accordance with one or more embodiments of the present application;

Corresponding reference numerals indicate corresponding parts throughout the several views of the drawings.

DESCRIPTION OF THE PREFERRED EMBODIMENTS

Figure 1:
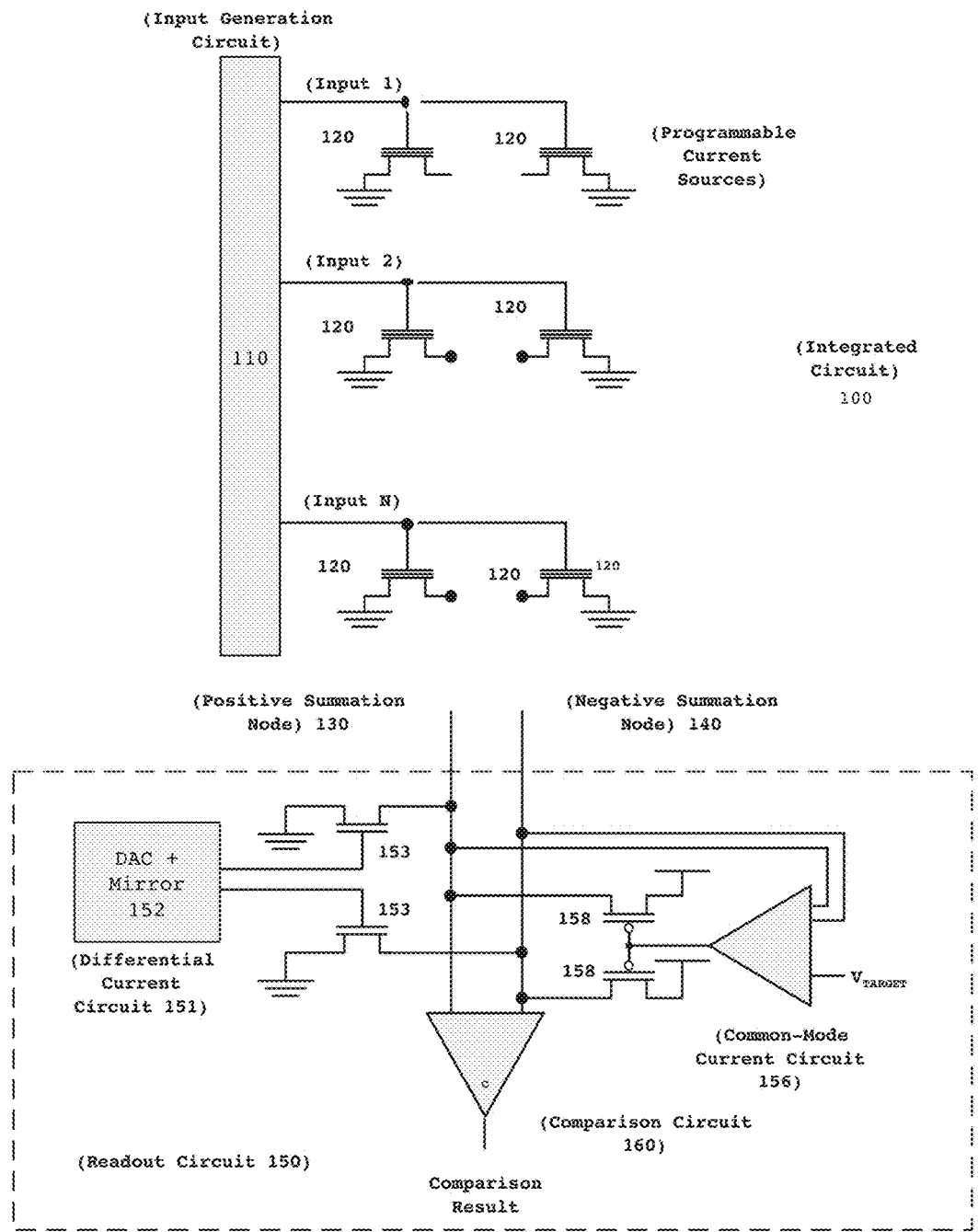
FIG. 1 illustrates a schematic of an integrated circuit 100 in accordance with one or more embodiments of the present application.

The following description of preferred embodiments of the present application are not intended to limit the inventions to these preferred embodiments, but rather to enable any person skilled in the art of to make and use these inventions.

Overview

In traditional integrated circuits used in implementing computationally-intensive programs or applications (e.g., deep neural network algorithms) and the like, the typical integrated circuit (IC) architecture includes relatively large circuits requiring large area and power to operate and perform computations. This is because processing digital signals (e.g., binary signals) often requires large and power-hungry implementations of circuits. Thus, for many technological implementations of computationally-intensive programs, such as artificial intelligence models, the resulting computer ICs having these large circuits for processing digital signals are also large and therefore, less feasible to include in space-constrained edge devices and the like.

Further, a great majority of the computational effort of an integrated circuit in implementing computationally-intensive applications, such as neural network models, involve performing thousands to millions of matrix multiplications. Further, in digital signal processing for neural network models, multiply-accumulate operations may also be performed in which a product of two numbers is computed and the product then added to an accumulator. Thus, when neural network models are implemented using only or primarily digital circuitry, the resulting digital circuitry consumes large amounts of energy performing the calculations and storing weight coefficients for neurons and resultant products of the many multiply-accumulate operations.

As a technical solution to reduce power required for computing and an overall size of an integrated circuit that is capable of computationally-intensive processes includes providing mixed-signal computing architectures that may be implemented utilizing extremely area efficient digital-to-analog converters (DACs) (rather than standard DACs which are fundamentally large, or area-intensive) along-side the various other circuitry of an integrated circuit to achieve area and energy efficiencies. Therefore, while traditional implementations of DAC architectures may be useful to reduce energy required by and an overall size of an integrated circuit, these traditional implementations of DAC architectures may not be feasible due to the large number of DACs that may be necessary to process computationally-intensive AI programs and applications.

The embodiments of the present application, however, solve at least the above-noted technical problems by implementing, in various forms, a global (reference signal source) DAC that may be in operable communication with one or more analog-to-digital converters.

Accordingly, an integrated circuit is provided that performs weighted sum computations. The integrated circuit preferably includes: a plurality of current generation elements interconnected and arranged into pairs, a positive summation node, a negative summation node, and an input generation circuit. For each pair of current generation elements, the input terminal of each element is electrically connected to the input generation circuit. Each current generation element includes an input terminal and an output terminal. In one example, the current generation element may be a memristor or a similar two terminal device. In this example, the input terminal of the memristor is coupled to the input generation circuit and the output terminal is coupled to one of the summation nodes. In another example, the current generation element may be a floating-gate transistor or similar three terminal device. In this example, the control terminal of the device acts as an input and is coupled to the input generation circuit; whereas, one of the source terminal or drain terminal acts as an output and is coupled to one of the summation nodes. Each pair of current generation elements source predetermined amounts of current onto the two summation nodes when the following conditions occur: the input node is at an activation voltage, and the two summation nodes are at a predetermined target voltage. The activation voltage as referred to herein relates to a voltage value at which current sourced by the programmable current sources begin to increase with voltage. Thus, the activation voltage may relate to a voltage value that causes the programmable current sources to produce detectable current signals. The difference in these two sourced currents represent a value, and the value varies among the plurality of current generation element pairs. Since each pair is electrically connected to the same two summation nodes, their currents naturally sum on these nodes so that the total difference in current between the two nodes is equal to the sum of the pair values.

To accomplish the above, the integrated circuit includes a common-mode current generation circuit, a differential current generation circuit, and a comparison circuit. The common-mode current circuit measures the average voltage of the two summation nodes and outputs an equal current to each node such that the average voltage becomes equal to the target voltage. The differential current circuit outputs a known, changing current to each line that is equal in magnitude but opposite in direction. Additionally, or alternatively, as discussed herein the differential current circuit may function to output known, changing current to each line that vary in magnitude in a same (i.e., same sign) or opposite direction (e.g., different signs). The comparison circuit outputs a signal which indicates which summation line is greater in voltage. When the comparison output circuit changes, it is known that the two summation nodes were momentarily equal to the target voltage (e.g., crossing), the current being generated by the differential current circuit was equal to the summation value, and that the value of the differential current can be recorded as the result.

Accordingly, a reduction in DAC architecture area may be achieved and, computer and power efficiencies that enable edge computing devices and the like to perform complex and computer-intensive operations including AI computing locally at a source of the input data.

1. A System for Mixed-Signal Computing

As shown in FIG. 1, an integrated circuit 100 for implementing mixed-signal computing for computationally-intensive programs and/or applications includes an input circuit 110, a plurality of programmable current sources 120, a first summation node 130, a second summation node 140, and a readout circuit 150. Preferably, the readout circuit 150 includes a differential current circuit 151 and a common-mode current circuit 156.

The integrated circuit 100 preferably functions to perform weighted sum computations for compute-intensive applications or programs in the analog domain (rather than the digital domain) by pre-storing computation weights or similar coefficients in current generation elements and using the current generation elements to generate current values in response to an input while mixed-signal circuitry may be implemented to identify an output code (e.g., a digital output) based on a weighted sum calculation of the current values produced by the current generation elements.

Figure 11:
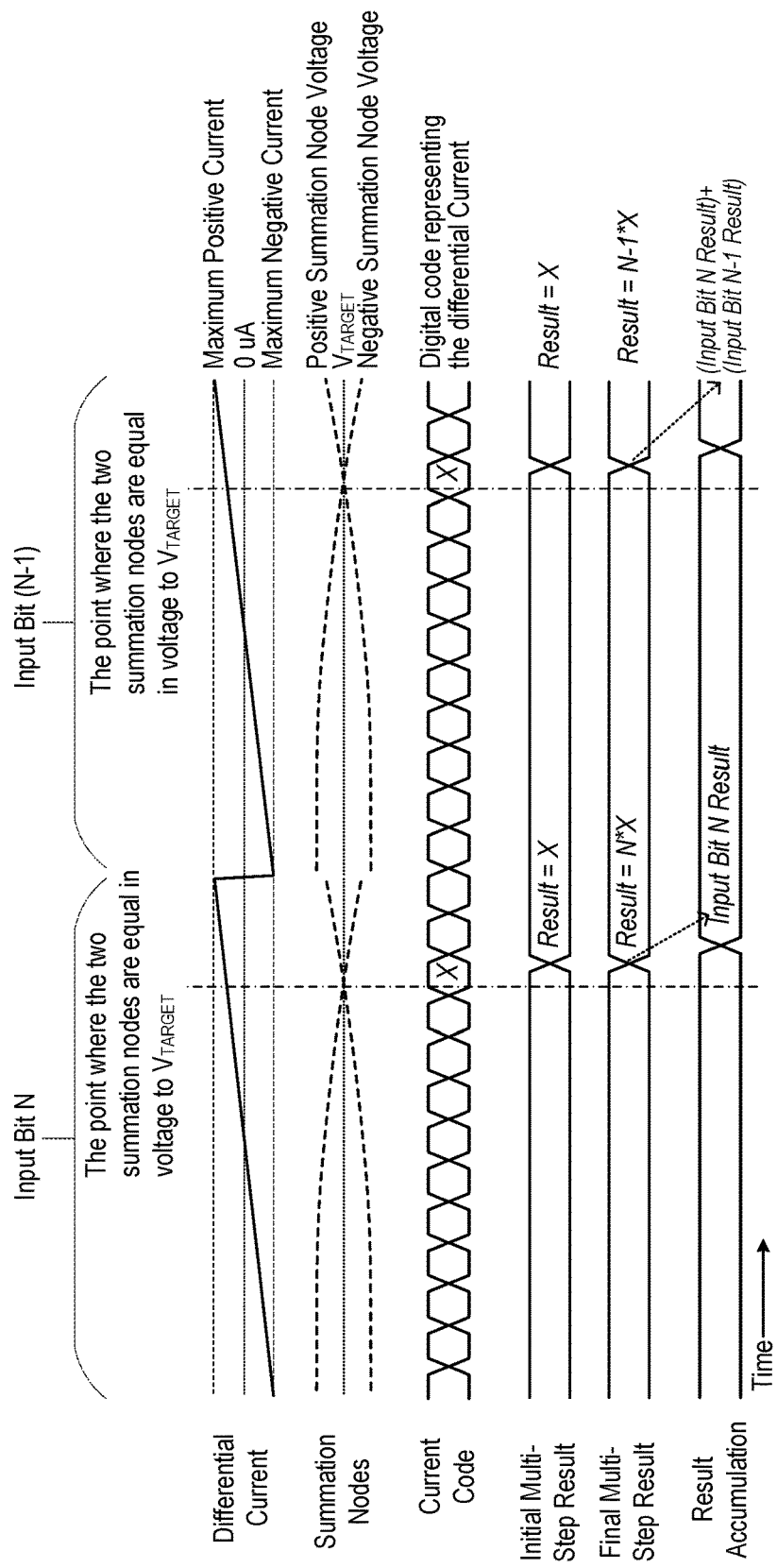
FIG. 11 illustrates a multi-step digital input implemented with an integrated circuit in accordance with one or more embodiments of the present application.
Figure 12:
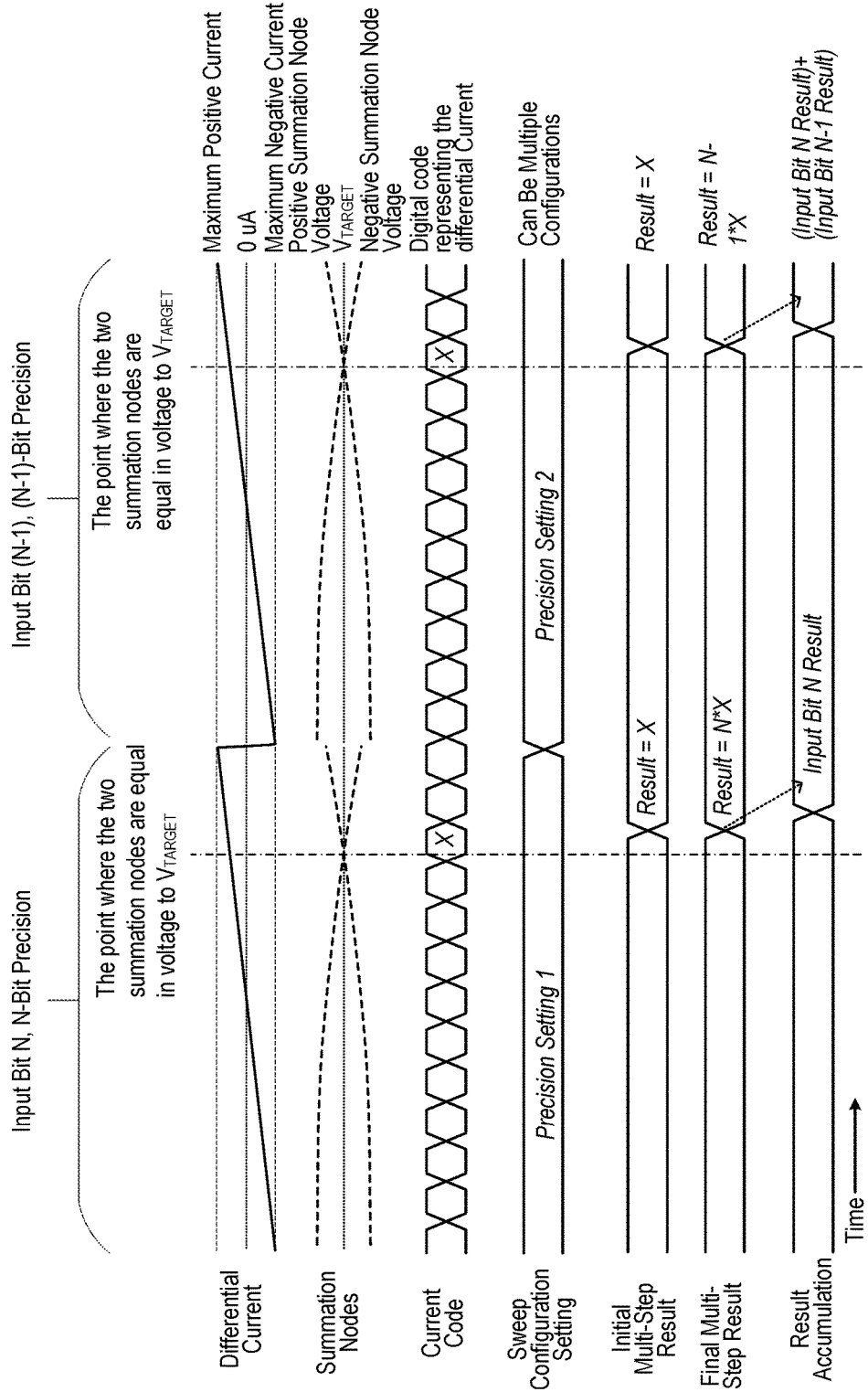
FIG. 12 illustrates a varied multi-step digital input implemented with an integrated circuit in accordance with one or more embodiments of the present application.

The input (generation) circuit 110 preferably functions to provide an input signal to one or more of an array of programmable current sources 120. In some embodiments, the input circuit no is configured to generate and/or provide a set of input signals for a plurality of programmable current sources 120. The input circuit may function to receive a digital (e.g., binary) input signal or analog input signal from one or more input signal sources. The one or more input signal sources may include another integrated circuit layer that is in operable signal communication with the input circuit no, an external input sensor (e.g., a camera, etc.), a switch, an off-chip device or circuit (e.g., off-chip memory, etc.), and the like. As shown by way of example in FIGS. 11-12, the input circuit 110 may additionally or alternatively function to provide digital input signals within the integrated circuit 100 within a multi-step fashion in which each pair of programmable current sources receives a series of input signals and in response, generate a series of corresponding outputs.

In some embodiments, the input circuit 110 may be configured as a single circuit with multiple signal output ports where each of the multiple output ports may be in electrical communication with a signal input terminal of a programmable current source 120. That is, each signal output port may be electrically coupled or otherwise, electrically connected to a corresponding signal input receiving terminal of a programmable current source 120 or of paired programmable current sources 120. Additionally, or alternatively, the input circuit 110 may be configured as multiple disparate circuits where each of the multiple disparate circuits includes a single signal output port that is placed in electrical communication with a signal input terminal of a programmable current source 120.

In some embodiments, the input circuit 110 may be configured to convert a digital input signal to an analog input signal. In such embodiments, the input circuit 110 may include a digital-to-analog converter that functions to receive digital input signals and convert the digital input signals to an analog output signals comprehensible to the analog circuitry of circuit 100. For instance, the input circuit 110 may function to receive a binary input signal from a digital sensor and convert the binary input signal to a voltage signal and pass the voltage signal to a programmable current source 120. Accordingly, the input circuit 110 may include a voltage controller circuit (e.g., a microcontroller having a computer processor or the like) that is configured to generate varying voltage signals based on received input signals to control the programmable current sources 120.

In a preferred embodiment, the plurality of programmable current sources 120 may be arranged in pairs that are placed in electrical communication or are electrically connected by connecting gate terminals of the programmable current sources 120 in the pair; however, it shall be noted that the programmable current sources may be connected as pairs in any suitable manner. Preferably, disparate pairs of programmable current sources are arranged in rows thereby forming a column or longitudinal array; however, in various embodiments, pairs of programmable current sources may be arranged in more or less than three rows or in any suitable number of rows. Additionally, each electrically connected pair of programmable current sources 120 may further be placed in electrical communication with or may be electrically connected to the input circuit 110, as mentioned above. That is, one or more gate terminals of a pair of programmable current sources 120 may be used to electrically connect the pair of programmable current sources 120 to each other as well as to an input node (port) or circuit of the input circuit no. In some embodiments, each pair of programmable current sources 120 includes a control terminal that is arranged in electrical communication with an input node of the input circuit no and one or more terminal of the pair may be connected to a reference generator or reference circuit, which may be shared among each of a plurality of paired programmable current sources. The reference generator, in some embodiments, comprises any suitable reference source, such as a global digital-to-analog converter (DAC) that may function to generate and source reference values for each pair of programmable current sources 120. The result of such configuration being that the input circuit 110 may be capable of transmitting a single input signal through a gate terminal of a pair of programmable current sources 120 and each of the current sources in the pair would function to receive the same single input signal from the input circuit 110.

A source terminal of each programmable current source 120 of a pair of programmable current sources 120 may be connected to ground or any suitable reference voltage while a drain terminal of each programmable current source 120 is connected to a respective current summation node. In a preferred embodiment, a drain terminal of a first programmable current source 120 of a pair of current sources may be electrically connected to a first current summation node 130 and a drain terminal of a second programmable current source 120 of the pair of current sources may be electrically connected to a second current summation node 140. Likewise, a source terminal of each of the first programmable current source 120 and the second programmable current source 120 of the pair of current sources may be electrically connected to a respective ground or to any suitable reference voltage.

In a preferred embodiment, an array of paired programmable current sources 120 may be arranged in the circuit 100. In such embodiment, a first programmable current source of each paired programmable current sources 120 of the array may share a first current summation node 130 and a second programmable current source of each paired programmable current sources 120 may share a second current summation node 140. The first summation node 130, in such embodiment, may function to sum positive currents supplied by each of the first programmable current sources and the second summation node 140 may function to sum negative currents supplied by each of the second programmable current sources. Accordingly, the array of paired programmable current sources 120 may be arranged in circuit 100 to take advantage of Kirchhoff's current law (KCL) for the purpose of summing the current supplied by the array of programmable current sources 120 along each of the first and second summation nodes 130, 140.

Figure 3:
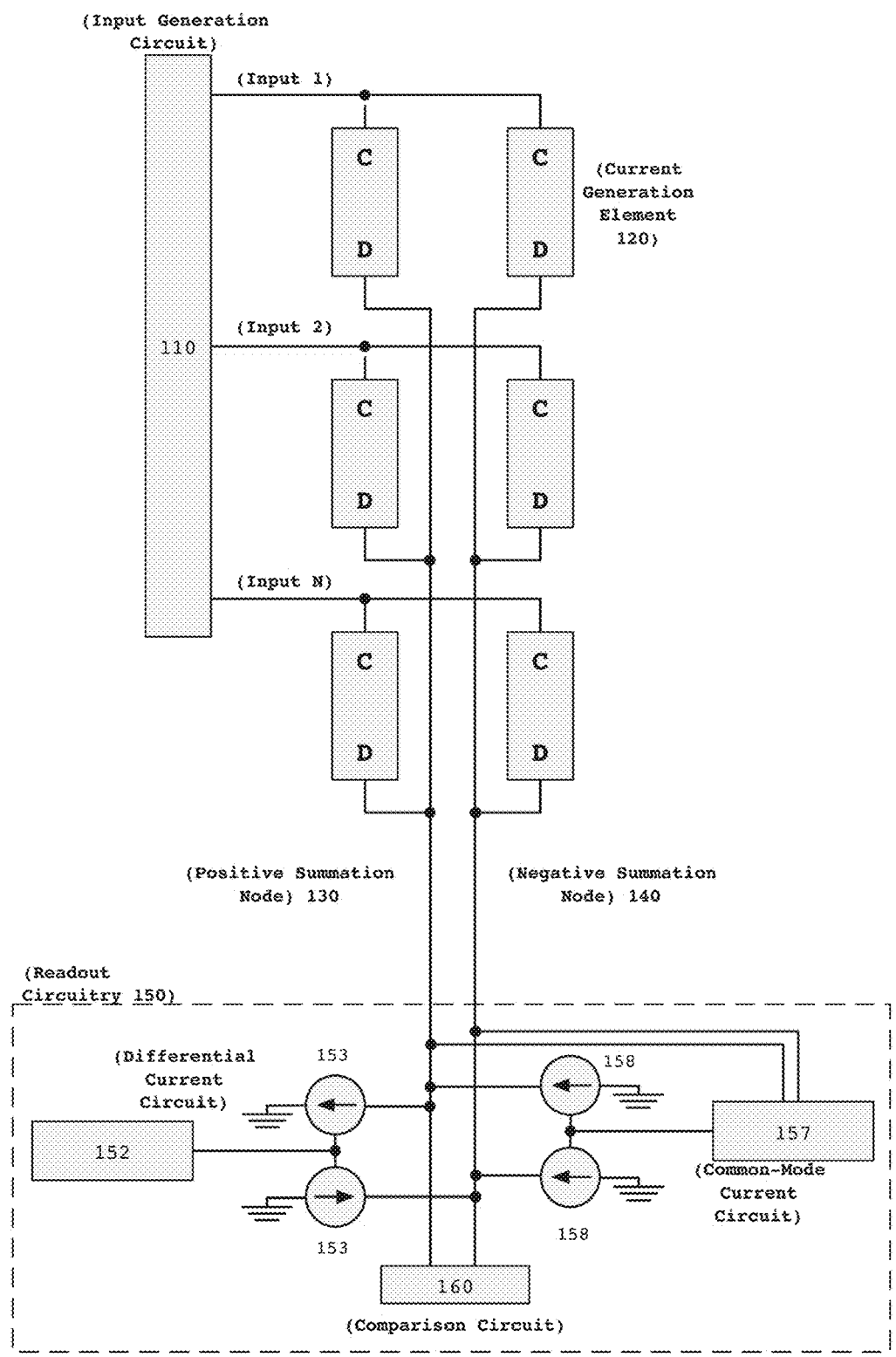
FIG. 3 illustrates a second schematic architecture of an integrated circuit in accordance with one or more embodiments of the present application.
Figure 4:
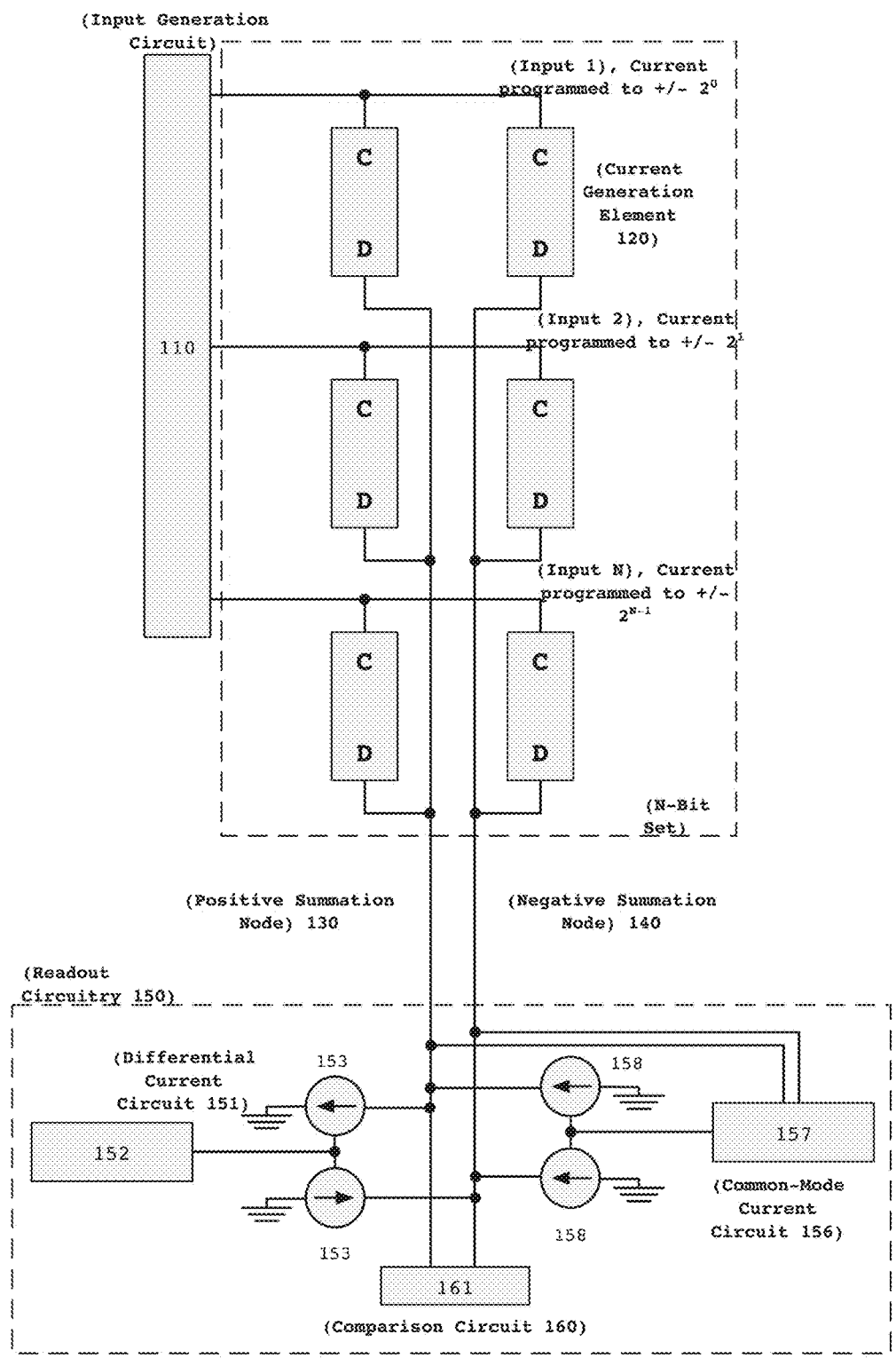
FIG. 4 illustrates a third schematic architecture of an integrated circuit in accordance with one or more embodiments of the present application.
Figure 5:
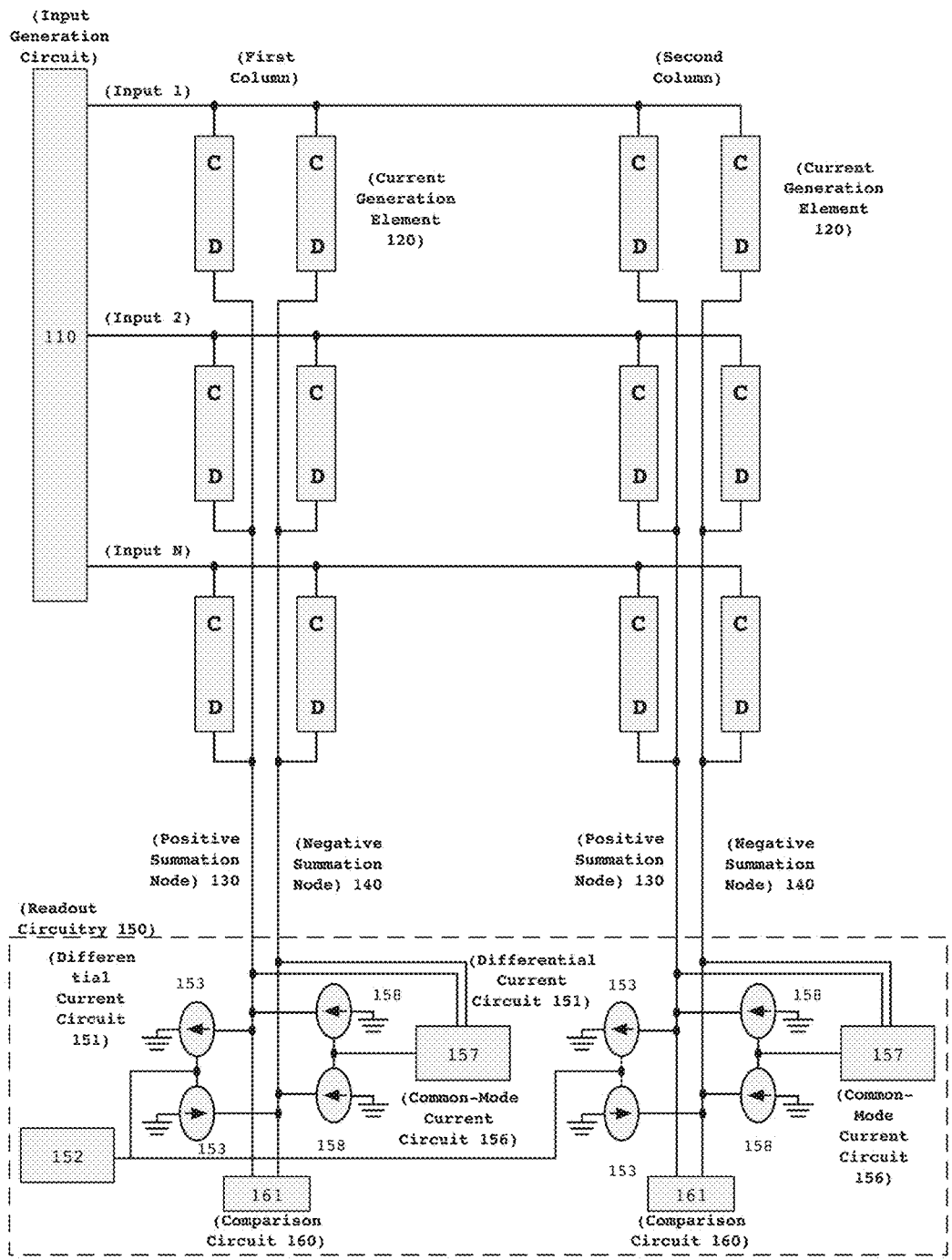
FIG. 5 illustrates a fourth schematic architecture of an integrated circuit in accordance with one or more embodiments of the present application.

In one implementation, the two or more arrays of programmable current sources 120 may be arranged in the circuit 100, as shown by way of example in FIG. 5. In this multi-column arrangement, each of the two or more arrays of programmable current sources 120 form columns that share the input generation circuit 110 and control logic 152 (e.g., microcontroller having a computer processor, processing circuit, or the like) of the differential current circuit 151, as shown by way of example in FIGS. 3-4. In this configuration, scale may be achieved in the circuit 100 because one or more components of the circuit 100 including the input generation circuit no and at least, the microcontroller of the differential current circuit 151 are not replicated.

Figure 6:
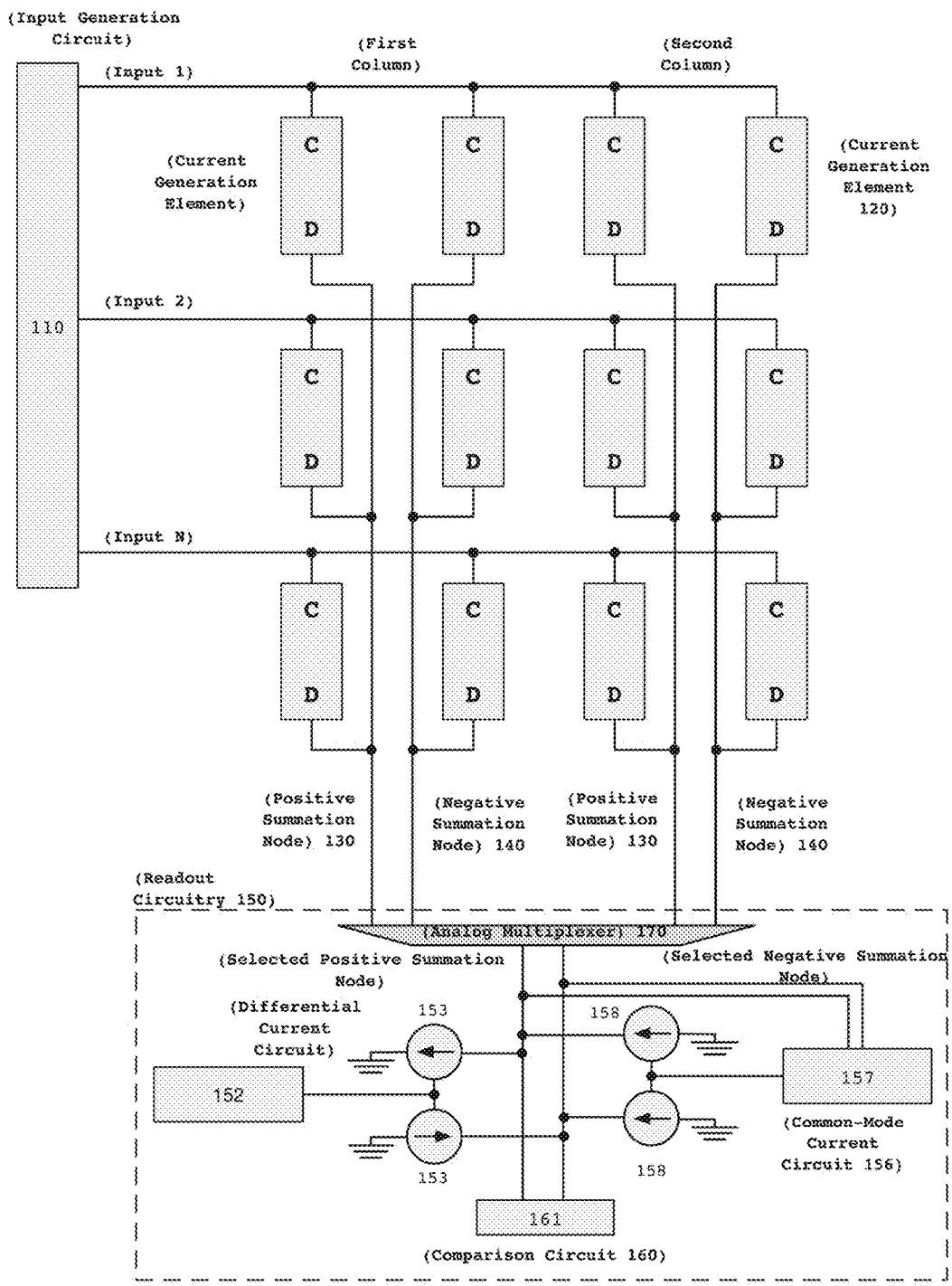
FIG. 6 illustrates a fifth schematic architecture of an integrated circuit in accordance with one or more embodiments of the present application.

In a second implementation in which two or more arrays of programmable current sources 120 may be arranged in the circuit 100, an analog multiplexer 170 may additionally be arranged within the circuit 100 to enable the multiple columns or arrays of programmable current sources 120 to share the differential current sources 153, the common-mode current circuit 156 and current sources 158, and the comparison circuitry 160, as shown by way of example in FIG. 6. Preferably, the analog multiplexer 170 functions to receive weighted summed currents from a first column or array of programmable current sources 120 and separately, from a second column or array of programmable current sources 120. In operation, the analog multiplexer 170 may function to alternate the weighted summed currents from each column or array of programmable current sources into the readout circuit 150. In this way, the functionality of the analog-to-digital converter of the readout circuit 150 may be amortized over multiple columns. While this implementation is illustrated with two columns or arrays of programmable current sources 120, it shall be understood that the analog multiplexer may be scaled for implementing any number of columns or arrays of programmable current sources 120.

In a variant of the second implementation, output states for each of multiple columns of programmable current sources 120 may be connected together in a shift chain such that the output results from each column of programmable current sources 120 may be shifted out from the shift chain at the end of a weighted sum calculation performed in circuit 100. This enables efficiencies in circuitry area of the circuit 100 in the case there is not sufficient space to position output circuitry for each of the multiple columns of programmable current sources 120 implemented in the circuit 100.

The first summation node 130 and the summation node 140 may include any type of conduit capable of transmitting or carrying an electrical charge. For instance, the first summation node 130 and the second summation node 140 may include an electrical conductor (e.g., a metal wire or trace, conductive fluids, etc.). It shall be noted that any suitable electrical conduit may be used for implementing the first and the second summation nodes 130, 140.

Figure 15:
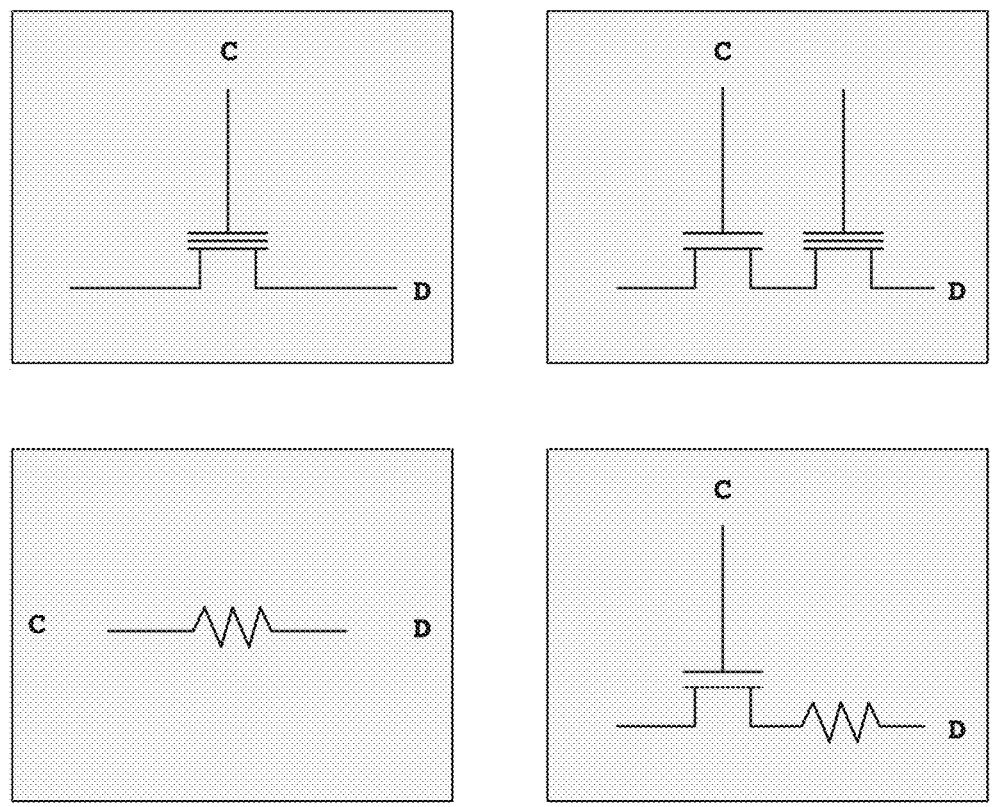
FIG. 15 illustrates example programmable current sources of an integrated circuit in accordance with one or more embodiments of the present application.

Each of the plurality of programmable current sources 120 preferably function to generate a current value in response to an input signal. In a preferred embodiment, a programmable current source 120 comprises a resistive circuit that functions to generate a current value when a voltage is applied. The resistive circuit may be any type of reconfigurable resistor (i.e., a tunable resistor) and preferably, the resistive circuit comprises a resistive random-access memory (RRAM or ReRAM) that is a type of non-volatile random-access computer memory that operates to change a resistance across a dielectric solid-state material, which may also be referred to as a memristor. In some embodiments, the programmable current sources 120 may be implemented using 1T (or 2T) NOR-flash transistors and/or other flash memory, as shown by way of example in FIG. 15. While in some embodiments implement NOR-flash transistors, it shall be understood that the programmable current sources may be implemented by a variety of current generation devices including other types of NOR- and NAND-flash devices, RRAM devices, or any suitable device known in the art.

In a preferred embodiment, the programmable current sources 120 may be preconfigured with a weight or a coefficient. For instance, weights and/or coefficients of machine learning model (e.g., a neural network model) may be mapped to pairs of the programmable current sources 120.

As mentioned previously, the programmable current sources 120 are preferably arranged into pairs and programmed in advance (i.e., preprogrammed) such that when a same input voltage signal is applied across the pair of programmable current sources 120, the pair of programmable current sources 120 output a pair of currents (a current output by each respective current source of the pair) having a difference that is programmed to be a specific or predetermined value. Accordingly, the difference between the respective currents sourced by the pair of programmable current sources 120 may be generated by programming the programmable current source arranged in electrical communication with the (positive) summation node 130 to a predetermined value (e.g., a positive weight or positive coefficient) and/or programming the programmable current source arranged in electrical communication with the (negative) summation node 140 to a predetermined value (e.g., a positive weight or positive coefficient). Accordingly, the output of the pair of currents by the programmable current sources 120 having a predetermined difference value may be achieved when the input circuit 100 provides an input signal comprising a voltage input to the pair of programmable current sources 120 during a condition that two summation nodes are each at a target voltage ($V_{TARGET}$). Further, as described in more detail below, the readout circuit 150 may function to create the target voltage condition of the two summation nodes and while creating this condition, the readout circuit 150 may also function to determine the summed difference in current for the programmable current sources 120. Accordingly, a weighted sum calculation result may be determined in this manner by determining the summed current difference for a given set of inputs.

The readout circuit 150 preferably functions to determine from weighted sum current signal a digital output signal or code. The readout circuit 150 preferably includes a differential current circuit 151, a common-mode current circuit 156, and a comparator circuit 160 operating in concert to determine a weighted sum calculation result for a given set of inputs.

The differential current circuit 151 preferably includes current sources 153 and a differential microcontroller circuit 152 for controlling current generating currents using the current sources 153. The differential current circuit 151 preferably functions to generate and supply differential current values to each of the first and second current summation nodes 130, 140. In use, the differential current circuit 151 and the associated current sources 153 may function to generate two currents at a time with a known difference and sources one current to each of the first and second summation nodes 130, 140. Preferably, the two differential currents produced by the current sources of the differential current circuit may be equal in magnitude but have opposite signs (e.g., one positive current, one negative current of a same magnitude, [50 A, −50 A]). Additionally, or alternatively, the two differential currents produced by the two current sources 153 of the differential current circuit 151 may vary in magnitude such that a first current signal and a second current signal supplied by the two current sources 153 based on input signals from the differential current circuit 151 may have different magnitudes (e.g., [+8 A, +2 A], [+4 A, +6 A], or the like).

Each of the two differential current sources 153 of the differential current circuit 151 may be in electrical communication with one of the first current summation node 130 and the second current summation node 140. In some embodiments, each the two differential current sources 153 share a direct electrical connection with one of the first current summation node 130 and the second current summation node 140, such that a terminal of each of the two current sources is electrically connected or electrically coupled to one of the first and the second current summation nodes 130, 140.

In one implementation, the differential circuit 151 comprises a digital-to-analog converter (DAC) having current mirrors acting as a controller and that is preprogrammed with or have access to a set of known digital input values or codes. The DAC preferably functions to vary the differential current signals supplied by the two current sources 153 by converting the known or pre-set digital input values to analog signals (e.g., the differential current signals). The current mirrors may function to duplicate a first current through one active device (or current source) by controlling the current in another active device while keeping the output current constant irrespective of loading. In a preferred embodiment, the circuits defining the current mirrors include an inverting current amplifier or the like that functions to reverse a current direction.

In use, the DAC with current mirrors may function to ramp or sweep through the set of known digital values as input into the DAC and output resultant (and varying) current signals that may be added to each of the first and second summation nodes 130, 140. In a preferred embodiment, the DAC may ramp or sweep from the most negative known digital value to the most positive known digital value. Additionally, or alternatively, the DAC may sweep from a most positive known digital value to a most negative known digital value. While some of these embodiments may implement a differential current circuit comprising a DAC with current mirrors or the like to generate two differential currents, it shall be understood that any suitable and/or known device for generating differential currents may be implemented.

Figure 13:
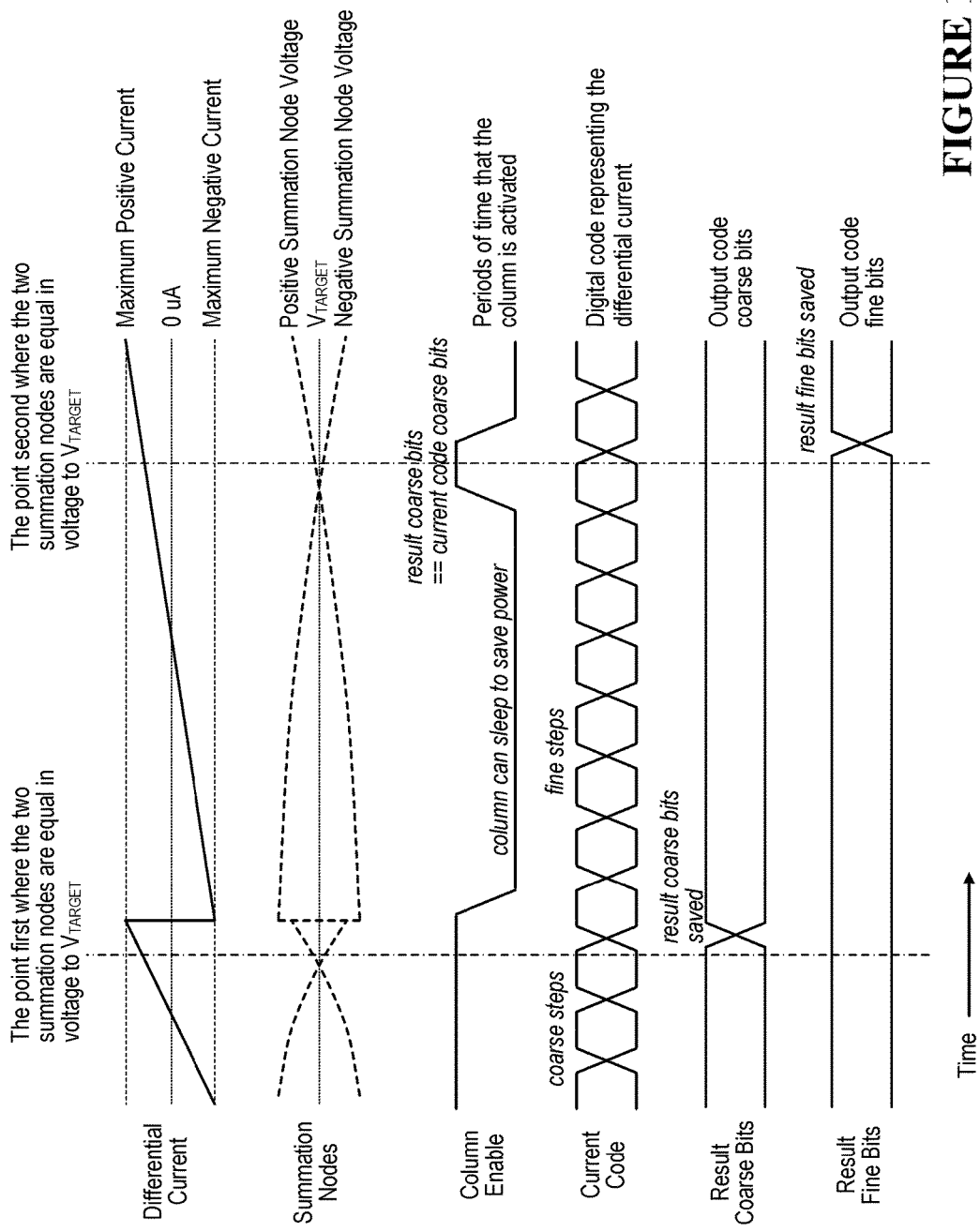
FIG. 13 illustrates a varied operation of a differential current circuit of an integrated circuit in accordance with one or more embodiments of the present application.

In a second implementation, multiple sweeps of DAC values may be performed across multiple readout circuits 150 (or multiple analog-to-digital converters). In this second implementation, one or more of the differential current sources 153, a common-mode current circuit 156 and current sources 158, and a comparator circuit 160 may include an additional sleep signal that deactivates a functionality thereof to preserve energy, as shown by way of example in FIG. 13. Preferably, the comparator circuit 160 may be operably coupled or connected to a control circuit 161 (e.g., a microcontroller having a computer processor, processing circuit, of the like), a group of coarse (MSB) registers, and a group of fine (LSB) registers. In operation, a first coarse sweep of a group of course registers (e.g., a subset of known and preset digital values) may be performed by the microcontroller in which the differential current circuit 151 steps through coarse code changes, and when the comparison circuit triggers, trips, or detects a change in the voltage between two summation nodes, the coarse bits are recorded. Subsequently, a full sweep of the known digital values is performed by the microcontroller, except when the recorded coarse bits do not match the coarse bits coming from the differential current circuit 151, the microcontroller circuit transmits a sleep signal to reduce the power consumption of a column. Accordingly, this second implementation enables a considerable power reduction by sleeping portions of the circuitry for $2^{\wedge}N-\frac{1}{2}^{\wedge}n$ of the time for the fine sweep, where N is the number of fine bits, as shown by way of example in FIG. 4. Therefore, the comparator circuit 160 and/or an associated output circuit may function to record the LSBs during the subsequent pass that correspond with times when the summed currents equaled zero or crossed.

Figure 14:
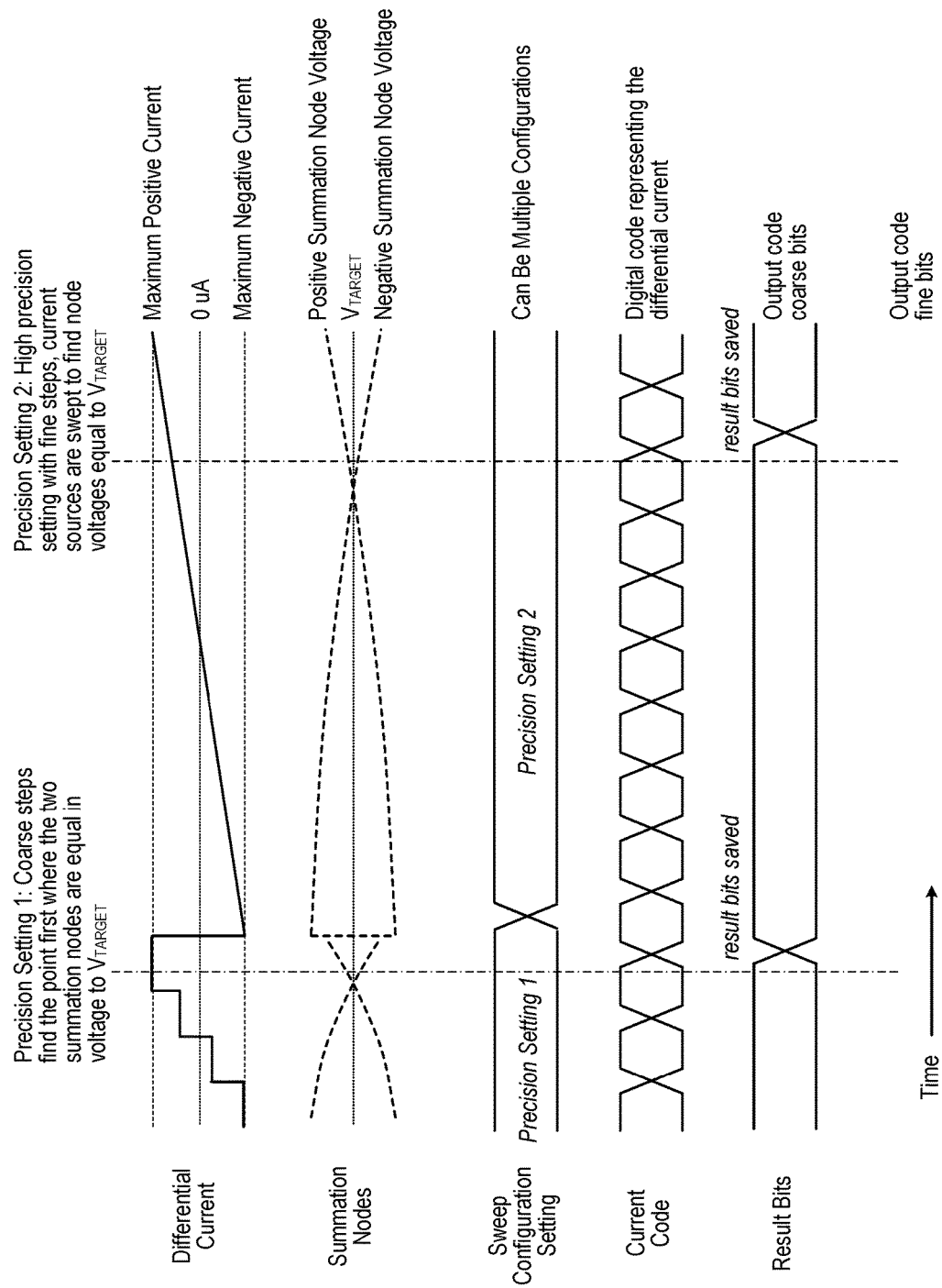
FIG. 14 illustrates a further varied operation of a differential current circuit of an integrated circuit in accordance with one or more embodiments of the present application.

In a third implementation, the programmable current sources 120 may be made to search different sweep resolutions of the differential current circuit 151, as shown by way of example in FIG. 14. Preferably, this configurable sweep resolution method may generally be achieved by changing a digital code sent by the differential circuit to the differential current sources 153. In one instance or time event of the circuit 100, the differential current circuit 153 may generate a set of digital codes representing an N-bit resolution, in a next instance or time event, the differential current circuit 151 may generate a set of digital codes representing an (N+1)-bit resolution or an (N−1)-bit resolution. This enables the circuit 100 to improve performance or reduce energy expended therein. The circuit 100 may generally produce any (N+X)-bit resolution, where X is a predetermined range of values such that X=(−N,+{max_resolution_of_system−N}]. This configuration can be performed by altering the LSB (i.e., group of fine registers) or the MSB (i.e., the group of coarse registers.

Figure 9:
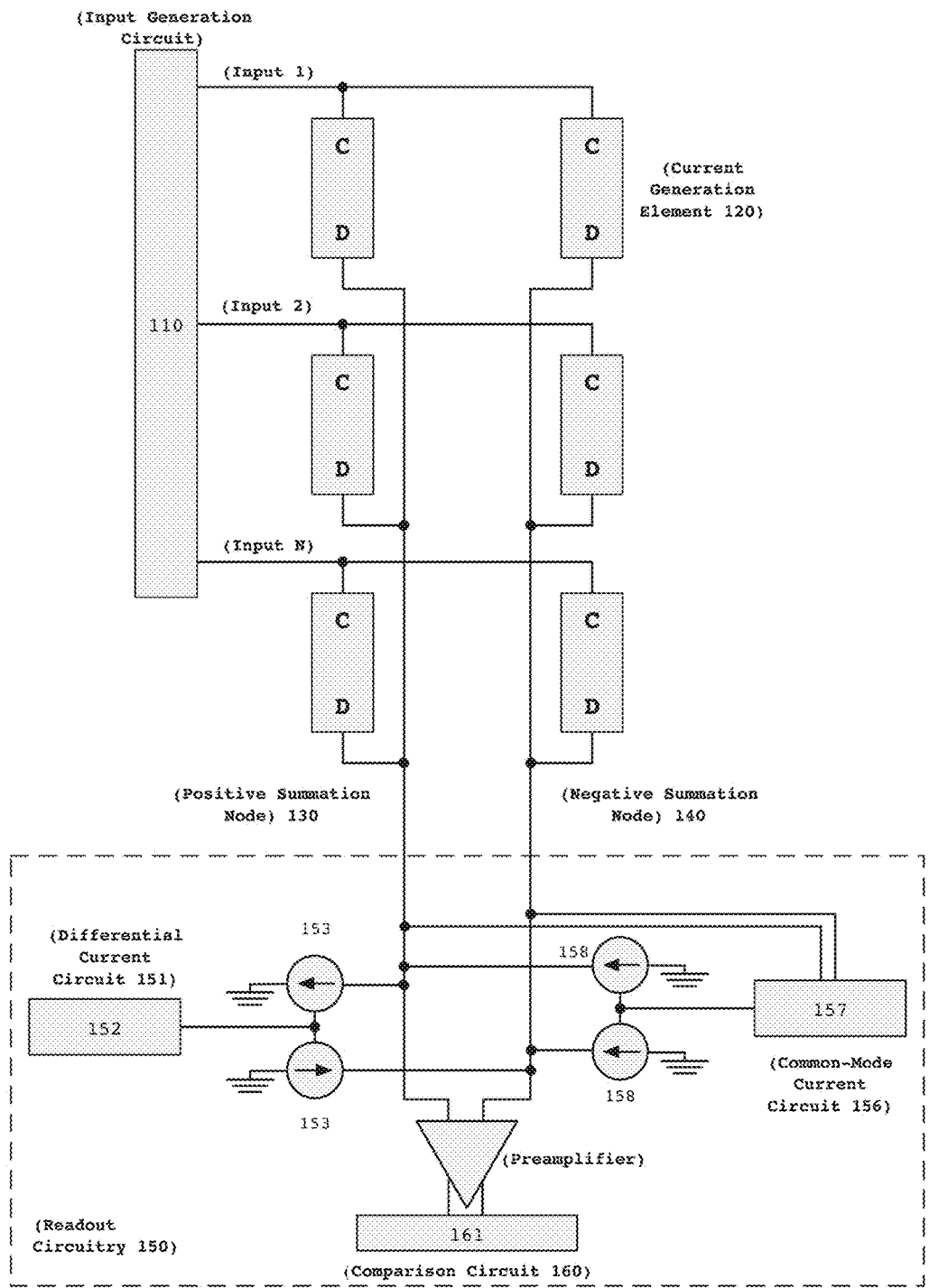
FIG. 9 illustrates an eighth schematic architecture of an integrated circuit in accordance with one or more embodiments of the present application.

The common-mode current circuit 156 preferably comprises two current sources 158, a common-mode control circuit 157 (e.g., a microcontroller having a computer processor, a processing circuit, or the like) an amplifier, and a common-source amplifier stage, as shown by way of example in FIG. 1 and in FIG. 9. The common-mode current circuit preferably functions to measure via a measuring circuit (which may sense voltage, current, or any electrical parameter or charge) an average voltage of the first and second summation nodes 130, 140. Responsively, the common-mode circuit may function to modulate the current sources 158 to output a current signal to each of the first and the second summation nodes 130, 140 so that the average voltage of the first and second summation nodes 130, 140 is equal to or substantially equal to a target voltage ($V_{TARGET}$). In a preferred embodiment, the current signals generated or sourced by the two current sources 158 and output to each respective summation node are equal in magnitude and sign.

Due to imperfect circuit components and/or one or more side effects within a circuit design of circuit 100, compensation circuitry and/or compensation methods may be implemented within the circuit 100 to mitigate side effects or other unintended issues in the design of circuit 100. As one example, offset between the common-mode current driving transistors may function to cause an offset in current through programmable current sources 120 thereby corrupting the input signal from the input circuit 110. Accordingly, in advance of implementing the circuit 100, the common-mode circuit 156 may be calibrated to compensate for the offset in current (i.e., the offset in current is calibrated out).

Figure 16A:
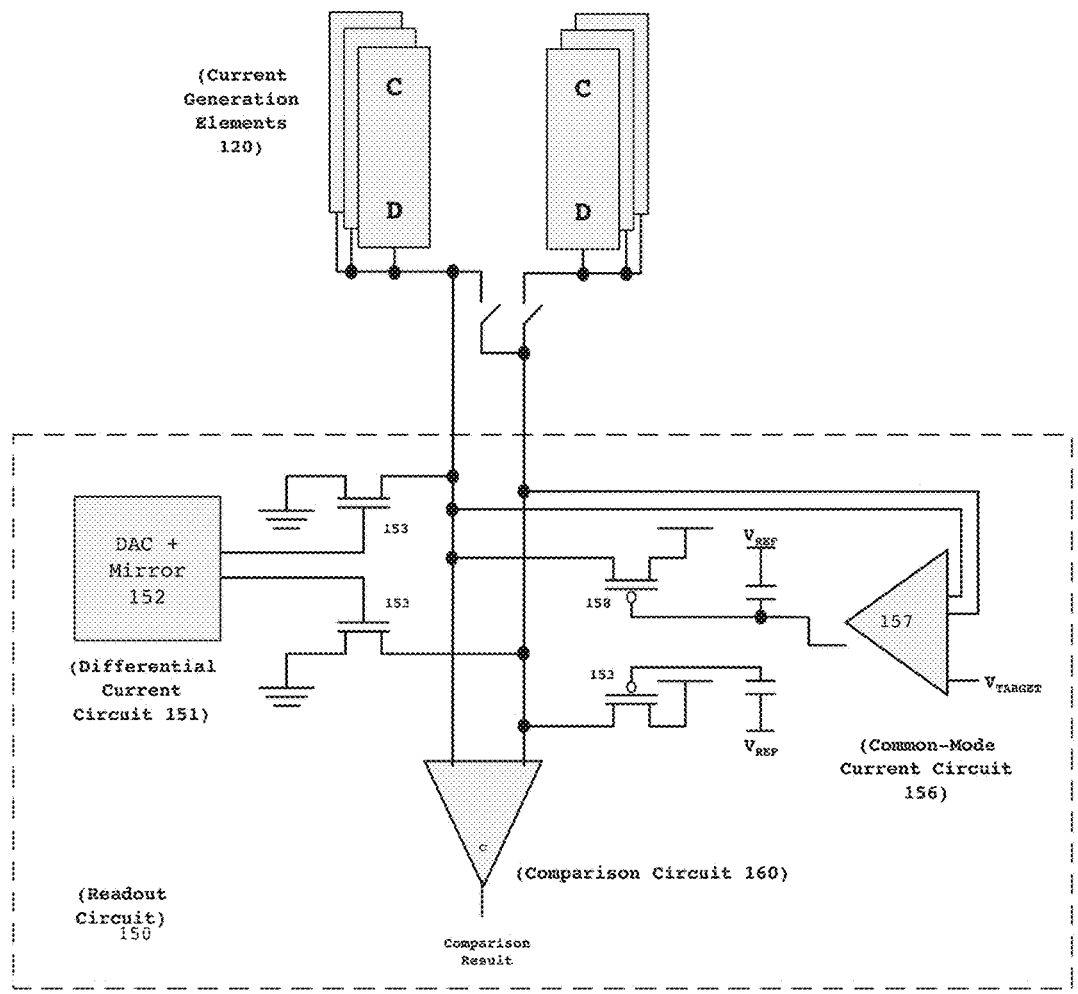
FIGS. 16A-16C illustrates example compensation circuitry implemented with a common-mode circuit in accordance with one or more embodiments of the present application.

Preferably, in a first phase of compensation calibration, a selected set of programmable current sources 120 may be electrically connected to the first summation node 130 (e.g., the positive summation node), as shown in FIG. 16A. In this implementation, an amplifier of the common-mode circuit 156 functions to drive a first capacitor referenced to a voltage reference ($V_{ref}$) so that the first summation node 130 is equal to or substantially equal to a target voltage ($V_{target}$). In this phase, $V_{ref}$ is selected for enabling good operating conditions of the amplifier of the common-mode circuit 156 and may represent a nominal value needed on the gate of the P-type metal-oxide-semiconductor (PMOS) devices (e.g., transistors) to achieve $V_{target}$ without offset. Consequently, the amplifier of the common-mode current circuit 156 drives a voltage across the first capacitor that represents the offset of that transistor from an ideal state.

Figure 16B:
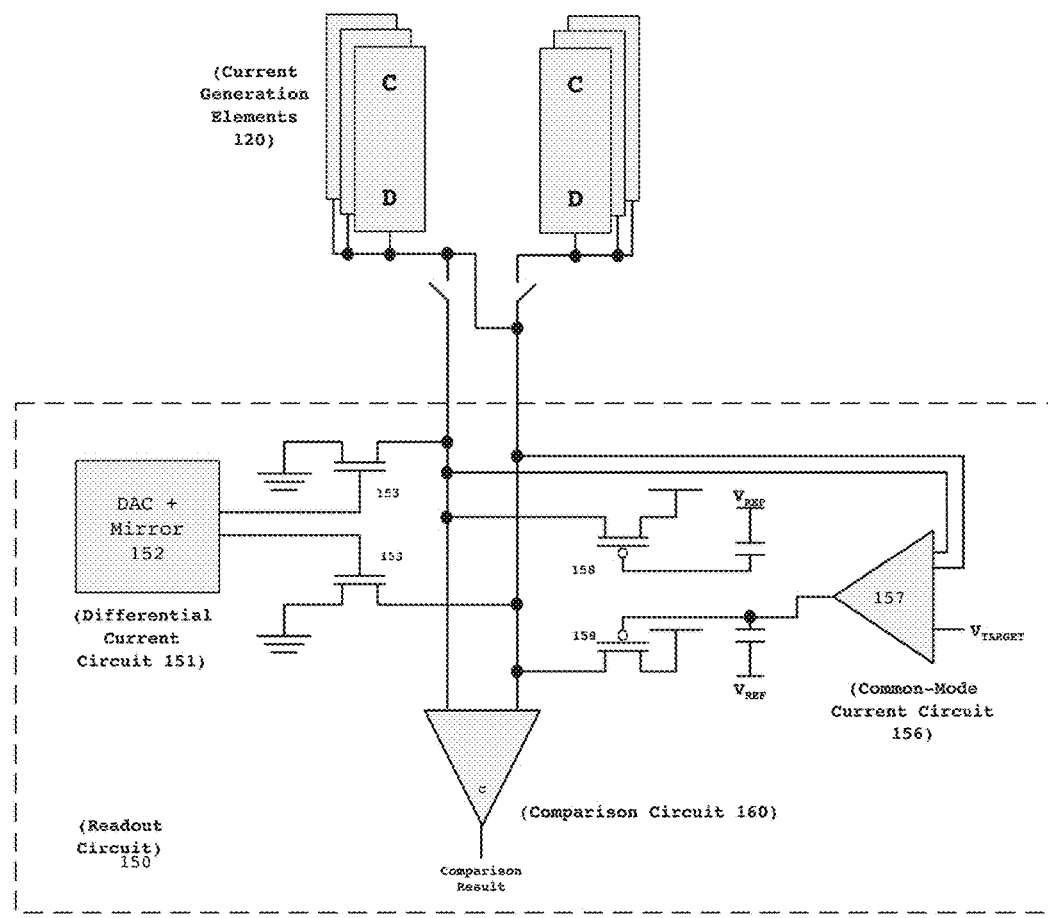

In a second phase, the selected set of programmable current sources 120 (i.e., the same set) of programmable current sources 120 (having identical current signals) may be connected to the second summation node 140 (e.g., the negative summation node), as shown by way of example in FIG. 16B. The amplifier of the common-mode current circuit 156 may function to drive a second capacitor that may also be referenced to the voltage reference ($V_{ref}$) so that the second summation node 140 is equal to or substantially equal to a target voltage ($V_{target}$).

Figure 16C:
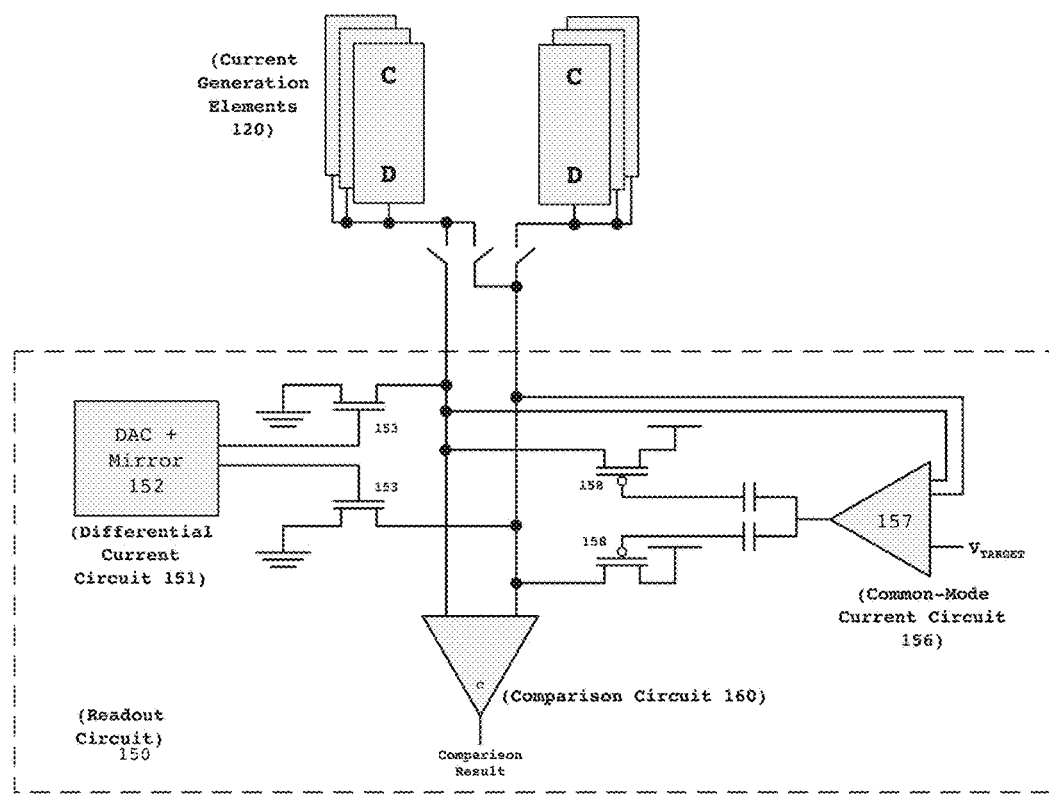

As result of the first phase and the second phase of compensation calibration, a difference in voltage between the first and the second capacitor may represent the difference in offset current (e.g., compensation current) generated by the two PMOS devices, as shown by way of example in FIG. 16C. It shall be noted that the compensation calibration may implement any same set of programmable current sources 120 between the first and the second phase of calibration and may function to operate on either the first summation node 130 or the negative summation node 140 in the first or second phase. It shall also be noted that the implemented transistors in the circuit 100 may be n-channel metal-oxide-semiconductor field effect (NMOS) while the transistors of the common-mode circuit 156 may be PMOS, the arrangement of the NMOS transistors and the PMOS transistors may be flipped or switch, such that the common-mode circuit 156 implements NMOS transistors and PMOS transistors may be implemented elsewhere including with the differential current circuit 151.

In operation, the amplifier of the common-mode circuit 156 may function to drive a bottom plate of the difference-storing capacitors such that the common-mode current driving sources 158 each receive a voltage modified by its corresponding stored offset.

The first and the second summation nodes 130, 140 preferably have two sources of differential currents including the summed programmable current sources 120 and the differential current circuit 151. In operation, when the two sources of differential currents are equal but opposite, they will cancel, and the result will be no total differential current. When this condition of zero differential current is met, the common-mode current circuit 156 and the two current sources 158 will make the first and the second summation nodes 130, 140 to be equal to $V_{TARGET}$, thereby enabling the condition that all differential currents are known by being in the correct voltage condition.

The readout circuit 150 preferably functions to identify or determine an equal-but-opposite current condition between the two sources of differential currents by changing the differential current generated by the current sources 153 and reading an output of the comparison circuit 160. When differences between the two sources of differential currents are not equal, one summation node of the two summation nodes 130, 140 will have a determined voltage that is greater than a determined voltage of the other summation node and the comparison circuit 160 will maintain or generate a first output indicating which summation node is greater in voltage. The node having the higher voltage value may depend on whether the differential current circuit 151 is sourcing more positive or more negative differential current than the sum of the programmable current sources 120. As described in some detail above, the differential current sourced by the differential current circuit 151 may be swept from a most negative value to a most positive value or conversely, a most positive value to a most negative value, and the comparison circuit 160 will change its output at the point that the two differences in current cross. That is, when the sum of the two differential current sources is equal to zero or the voltage values in both the first and the second summation nodes 130, 140 is equal to ($V_{TARGET}$), the comparison circuit 160 will change its output. At the time that the comparison circuit 160 changes its output, the differential current values sourced to the summation nodes by the differential current circuit may be recorded and referenced by an analog-to-digital converter to generate a digital output code representing the weighted sum difference of the two programmable current sources 120. Further, at that time, it is known that the recorded two differential current values sourced by the differential current circuit were equal in magnitude but opposite in direction with respect to the summation of the two differential currents of the first and second summation nodes 130, 140.

A controller is preferably interfaced with the differential current circuit and/or the comparison circuit. The controller interacts with the differential current circuit to change magnitude of the difference between the current supplied to the positive summation node and the current supplied to the negative summation node. For example, the controller may sweep magnitude of the difference in a range of values, where the range of values is defined between a maximum negative value and a maximum positive value as described above. In response to the signal indicating that the voltages at the positive summation node and the negative summation node are equal, the controller also receives the signal output by the comparison circuit and records the difference between the current supplied to the positive summation node and the current supplied to the negative summation node. In one embodiment, the controller is implemented by a microcontroller or other suitable circuitry.

Figure 7:
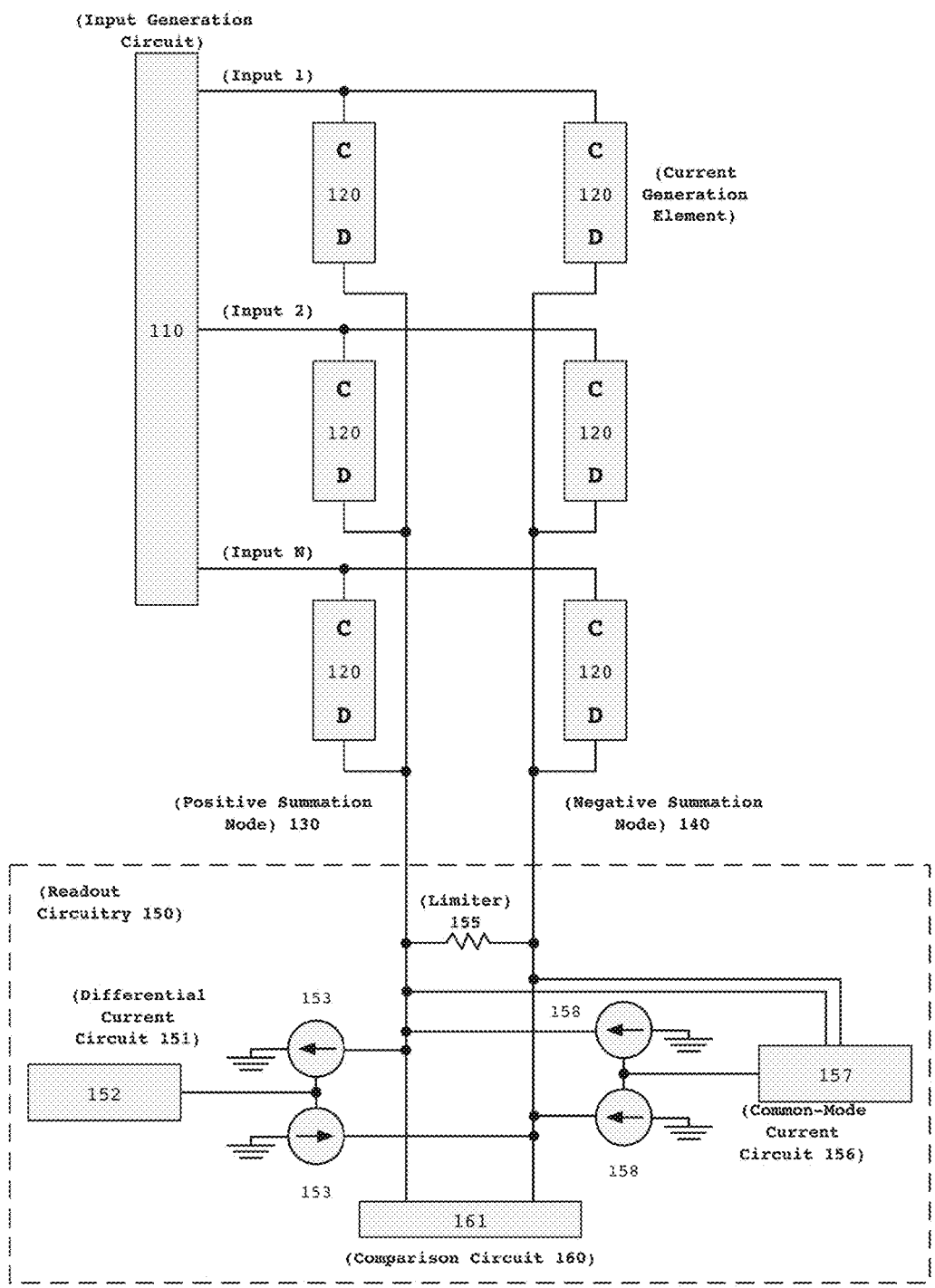
FIG. 7 illustrates a sixth schematic architecture of an integrated circuit in accordance with one or more embodiments of the present application.

In one implementation, the readout circuit 150 further comprises a voltage limiter 155 that is preferably arranged between the first and the second summation nodes 130, 140, as shown by way of example in FIG. 7. In this implementation, the voltage limiter 155 may function to limit a voltage that develops between the first and the second summation nodes 130, 140 thereby improving a performance of the circuit 100 since a limit to the voltage that can be achieved in the two summation nodes may be known or identified to the common mode circuit 156. The functionality of the two summations nodes may generally be unchanged with the addition of the voltage limiter since a resistor of the voltage limiter 155 provides no current to the summation nodes. It shall be understood that the resistor of the voltage limiter 155 may be implemented in any suitable manner, including as a transistor. Additionally, varying resistor strengths may be enabled or implemented based on a current operating mode of the circuit 100.

Figure 8:
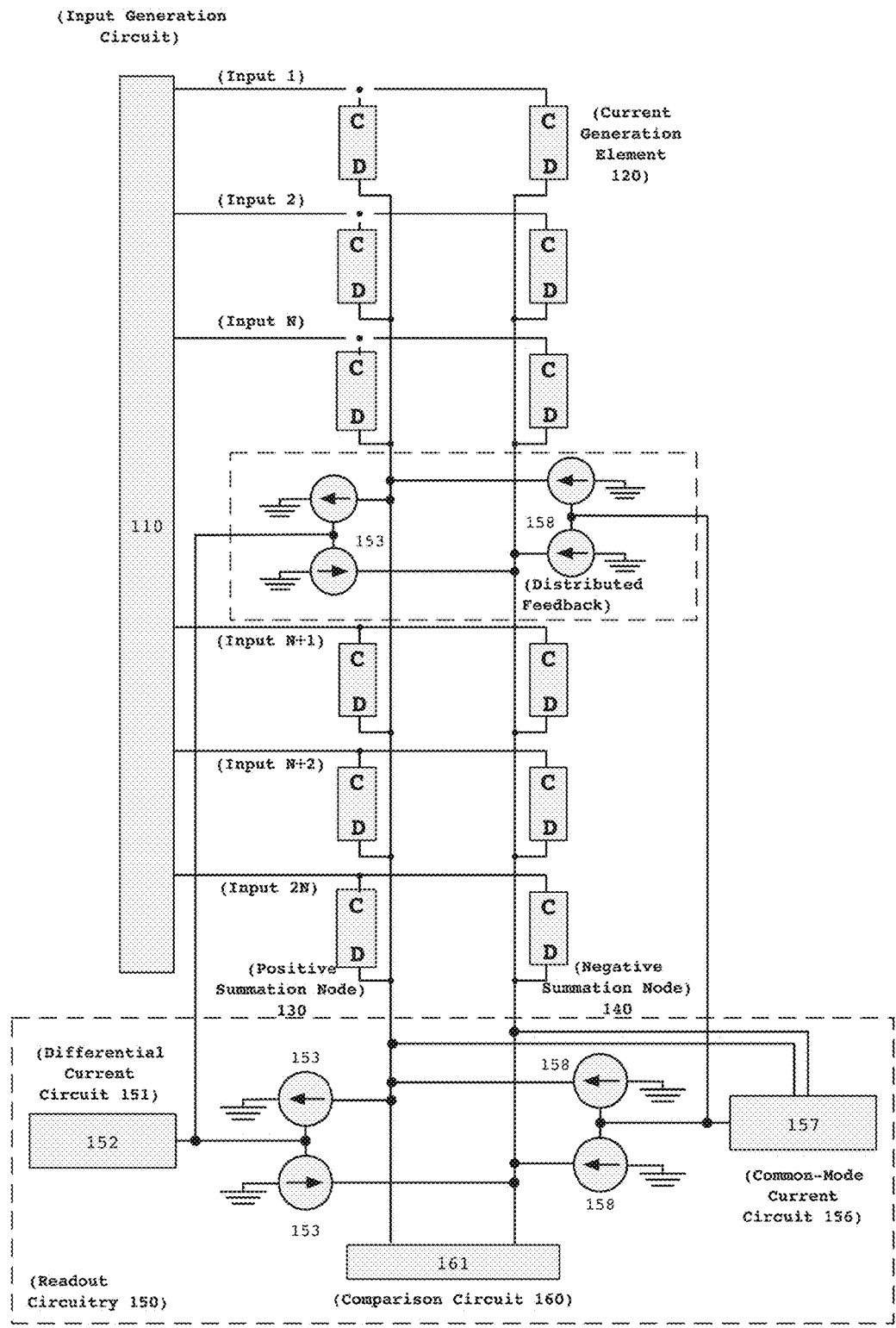
FIG. 8 illustrates a seventh schematic architecture of an integrated circuit in accordance with one or more embodiments of the present application.

In one variation of the above circuit 100, the circuit 100 may include distributed, multiple sets of differential current sources 153 and common current sources 158 along a length of the first and/or the second current summation nodes 130, 140, as shown by way of example in FIG. 8. In such a configuration, the microcontroller circuits of either the differential current circuits or the common-mode current circuits may not need to be duplicated for controlling the multiple sets of differential current sources 153 and common current sources 158 along the first and the second current summation nodes 130, 140. A technical benefit of such a configuration is that the voltage drop that tends to occur because of long wires (e.g., summation nodes) and large currents (i.e., aggregation of multiple currents) may be mitigated.

2. A Method for Performing Weighted Sum Computations Using Mixed-Signal Circuitry As shown in FIG. 2, the method 200 includes generating an input signal S210, generating differential current signals S220, summing currents along a pair of summation nodes S230, sourcing predetermined differential current signals to the pair of summation nodes S240, sourcing a common current signal to the pair of summation nodes S250, and identifying a weighted sum difference of the pair of summation nodes S260.

S210, which includes generating an input signal, functions to generate one or more input signals to programmable current sources in response to a digital (e.g., binary) or an analog input. In a preferred embodiment, a digital input or an analog input may be received at an input circuit. In the case of receiving a digital input, S210 may function to implement the input circuit to generate digital input signals with only an activated state associated with a predetermined current, or a deactivated state, where no differential current is generated by programmable current sources. That is, each digital or binary input is associated with a single or finite associated analog current response, which also includes a value of zero for a current signal.

Additionally, or alternatively, in the case of receiving analog inputs into a system (e.g., circuit 100) implementing the method 200, S210 may function to implement the input circuit to generate analog input signals with multiple activation states, which have multiple corresponding predetermined currents, and a deactivated state, wherein no differential current is generated by programmable current sources.

In the case that an analog input signal is received at one or more programmable current sources, S220 may function to apply the analog input signals across the programmable current sources to generate one or more current signals. In a preferred embodiment, the input circuit implemented in S210 comprises a voltage-controlled input circuit and therefore, the input signals received by each of the programmable current sources includes a voltage signal. Accordingly, when a voltage signal is applied across a resistive element of the programmable current sources, a resulting current is generated. Preferably, the programmable current sources also include a pre-stored weight or coefficient which modifies a resistance strength of the resistive element of each programmable current source.

In the case that a binary input signal is received at one or more of the programmable current sources, a predetermined current signal may be generated by the programmable current source that processes the binary input signal.

S230, which includes summing currents along each of a pair of summation nodes, functions to sum a plurality of current signals at a first summation node and sum a plurality of current signals at a second summation node. Specifically, in a preferred embodiment, the programmable current sources may be arranged in pairs in which a first current source of the pair is in electrical communication with a first summation node and a second current source of the pair is in electrical communication with a second summation node. Further, multiple pairs of the programmable current sources may be arranged such that a first current source of each of the multiple pairs share (by way of electrical connection) the first summation node and a second current source of each of the multiple pairs share (by way of electrical connection) the second summation node. Thus, in such configuration, the first current source of each pair may supply a current to the first summation node and the second current source of each pair may supply a current to the second summation node.

Accordingly, S230 preferably functions to sum the current signals supplied to the first summation node as well as the current signals supplied to the second summation node by the array of programmable current sources.

S240, which includes sourcing differential current signals to the pair of summation nodes, functions to generate differential current signals having a same magnitude but different directions (i.e., one positive and one negative) to each of the first and second summation nodes of the pair. S240 preferably generates the differential current signals by implementing a differential current circuit, such as a digital-to-analog converter with a current mirror or any suitable differential current circuitry.

Figure 10:
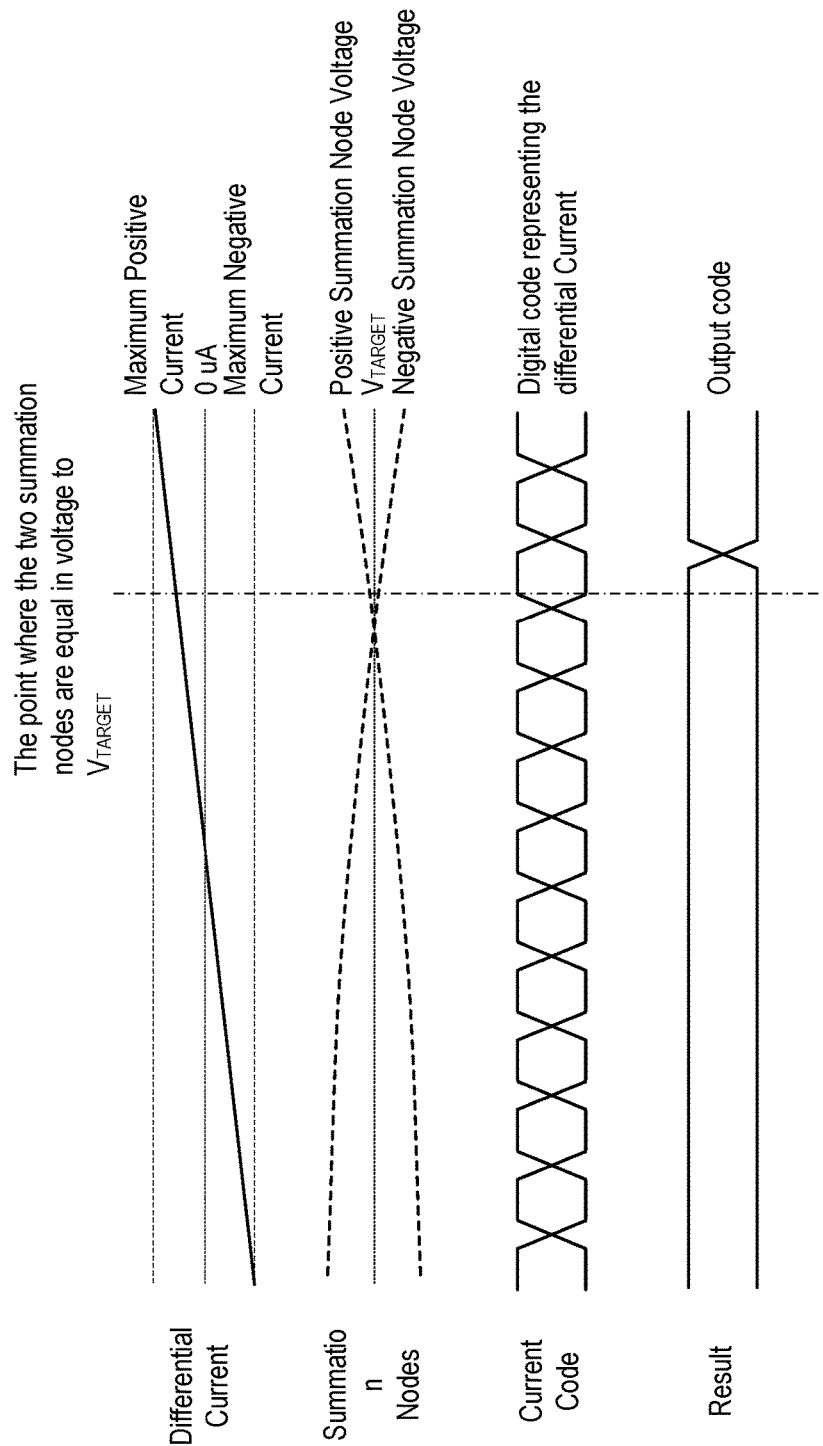
FIG. 10 illustrates an operation of a differential current circuit of an integrated circuit in accordance with one or more embodiments of the present application.

In operation, the differential current circuit implemented by S240 for sourcing differential currents to the pair of summation nodes may be preprogrammed or have access to a set of predetermined digital (binary) codes that when supplied to current sources of the differential current circuit causes the generation of varying differential currents that are supplied to the pair of summation nodes. In a preferred embodiment, the differential current circuit may function to sweep or ramp through the predetermined set of digital codes in any suitable manner until a summed difference between the pair of summation nodes may be determined, as shown by way of example in FIG. 10.

S250, which includes applying a common current signal to each summation node of the pair of summation nodes, functions to measure an average voltage between the pair of summation nodes and responsively generate and source two common current signals to the pair of summation nodes. The two common current signals preferably have a same magnitude and direction. Thus, S250 functions to use the two common current signals to adjust the average voltage of the pair of summation nodes to match a predetermined target voltage.

In a preferred embodiment, S250 functions to generate the common current signals using a common-mode current circuit comprising two current sources and a microcontroller circuit. When implemented by S250, the microcontroller measures the average voltage of the pair of summation nodes, calculates a common current signal to achieve an average target voltage in the pair of summation nodes and sources the common current signal via the two common current sources to each summation node of the pair of summation nodes.

S260, which include determining a weighted sum difference of the pair of summation nodes, functions to compare a voltage value of the first summation node to the second summation node and identify a time or instance at which voltage values of the first and second voltages are equal. Specifically, as a differential current circuit applies differential currents to the pair of summation nodes, as described in S240, S260 implementing a comparator circuit compares the voltage values of the pair of summation nodes.

Accordingly, when the voltage values of the first and the second summation nodes are equal, S260 functions to record the differential currents sourced by the differential current circuit. In this way, S260 may additionally perform a calculation that reduces total summed currents (i.e., currents from the two differential current sources including the programmable current sources and the differential current circuit) of each of the first and second summation nodes by the recorded differential currents. The result of the calculation should include summed differential current values of the pair of summation nodes sourced by the programmable current sources.

S260 may function to convert a difference value of the summed differential current values to an output code that is preferably digital. Additionally, or alternatively, S260 may function to identify an associated digital input code into the differential current circuit that generated the recorded differential current and output the associated digital input code. Additionally, or alternatively, S260 may function to collect or pass a value of the comparator circuit to a counter circuit that may function to record a time at which the compared current values crossed (e.g., when the summed currents equaled zero). The recorded time may be compared to the times at which digital signal was active in the DAC to generate a set of differential currents.

Additionally, or alternatively, S260 may function to output a digital code (e.g., a multi-bit signal) that corresponds to a digital code input or active within the DAC at the time at which the compared current values crossed.

It shall be understood that the method 200 is an exemplary method that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. A mixed-signal circuit for computing a weighted sum computation, comprising:
    a plurality of programmable current sources arranged in pairs, a first programmable current source in each pair of programmable current sources is configured to store a value indicative of a positive weight and a second programmable current source in each pair of programmable current sources is configured to store a value indicative of a negative weight, each programmable current source has an input terminal and an output terminal, such that output terminals of the first programmable current sources are electrically coupled together at a positive summation node and output terminals of the second programmable current sources are electrically coupled together at a negative summation node;
    an input circuit electrically coupled to each pair of programmable current sources in the plurality of programmable current sources and operates to supply current to each pair of programmable current sources in the plurality of programmable current sources;
    a comparison circuit electrically coupled to the positive summation node and the negative summation node, wherein the comparison circuit operates to compare voltages at the positive summation node and the negative summation node to each other and outputs a signal indicative of the comparison result;
    a differential current circuit electrically coupled to the positive summation node and the negative summation node and operates to supply a current to each of the positive summation node and the negative summation node, where the current supplied to the positive summation node exhibits a difference with the current supplied to the negative summation node; and
    a controller interfaced with the differential current circuit and the comparison circuit, wherein the controller interacts with the differential current circuit to change magnitude of the difference between the current supplied to the positive summation node and the current supplied to the negative summation node.

2. The mixed-signal circuit of claim 1 wherein the controller receives the signal output by the comparison circuit and, in response to the signal indicating that the voltages at the positive summation node and the negative summation node are equal, records the difference between the current supplied to the positive summation node and the current supplied to the negative summation node.

3. The mixed-signal circuit of claim 1 wherein the controller interacts with the differential current circuit to sweep magnitude of the difference in a range of values, where the range of values is defined between a maximum negative value and a maximum positive value.

4. The mixed-signal circuit of claim 1 further comprises a common-mode current circuit electrically coupled to the positive summation node and the negative summation node, wherein the common-mode current circuit determines an average of voltage at the positive summation node and the negative summation node and supplies a current to each of the positive summation node and the negative summation node, such that the average is maintained at a target voltage and magnitude of current supplied to the positive summation node and the negative summation node is equal.

5. The mixed-signal circuit of claim 1 wherein each programmable current source is further defined as one or more floating-gate transistors, such that a control terminal of the one or more floating-gate transistors is electrically coupled to the input circuit, a drain terminal of the one or more floating-gate transistors is electrically coupled to a respective summation node, and a source terminal of the one or more floating-gate transistors is electrically coupled to ground.

6. The mixed-signal circuit of claim 1 wherein each programmable current source is further defined as a memristor.

7. The mixed-signal circuit of claim 1 wherein the comparison circuit includes an operational amplifier or a regenerative latch.

8. The mixed-signal circuit of claim 1 further comprises a resistor electrically coupled between the positive summation node and the negative summation node.

9. An integrated circuit comprising:
a plurality of paired current sources, wherein a first current source and a second current source of each of the plurality of paired current sources being arranged in electrical communication, wherein each of the first current source and the second current source comprises a drain terminal, and a source terminal; wherein each of the plurality of paired current sources includes a control terminal arranged in electrical communication with an input node;
a pair of current summation nodes comprising a first current summation node and a second current summation node,
wherein:
the source terminal of each of the first current source and of the second current source of each of the plurality of paired current sources is connected to a ground;
the drain terminal of the first current source of each of the plurality of paired current sources is arranged in electrical communication with the first current summation node and the drain terminal of the second current source of each of the plurality of paired current sources is arranged in electrical communication with the second current summation node;
a differential current circuit comprising differential current controller and two differential current sources, wherein the differential current controller is in operable control communication with the two differential current sources, wherein each of the two differential current sources is arranged in electrical communication with one of the first current summation node and the second current summation node;
a common-mode current circuit comprising a common-mode current controller and two common current sources, wherein the common-mode current controller is in operable control communication with the two common current sources, wherein each of the two common current sources is arranged in electrical communication with one of the first current summation node and the second current summation node; and
a comparator circuit that is in electrical communication with a terminal end of the first current summation node and the second current summation node.

10. The integrated circuit according to claim 9, wherein:
the input node supplies a voltage input signal to the control terminal of each of the plurality of paired current sources; and
in response to voltage input signal, each of the plurality of paired current sources generates two differential currents, wherein a value of a difference between the two differential currents generated by each of the plurality of paired current sources varies, and wherein each of the two differential currents of each of the plurality of paired current sources is sourced to one of the first summation node and the second summation node.

11. The integrated circuit according to claim 10, wherein:
the common-mode current circuit identifies an average voltage value of the first current summation node and the second current summation node,
in response to identifying the average voltage value of the first current summation node and the second current summation node, the common-mode controller sets the average voltage value of the first current summation node and the second current summation node to a predetermined target voltage by generating two common current signals and sources a first common current signal and a second common current signal of the two common current signals to each of the first current summation node and the second current summation node, respectively, wherein a magnitude and a direction of the two common current signals are equal.

12. The integrated circuit according to claim 11, wherein:
the differential current controller causes the two differential current sources to generate two predetermined differential current signals having a same predetermined magnitude and opposite directions,
the differential current circuit sources a first differential current and a second differential current of the two predetermined differential currents to the first current summation node and the second current summation node, respectively.

13. The integrated circuit according to claim 12, wherein:
the comparator circuit compares a total summed current sourced from the first current summation node and a total summed current sourced from the second current summation node; and
the comparator circuit outputs an indicator when the total summed current sourced from the first current summation node and the total summed current sourced from the second current summation node are equal.

14. The integrated circuit according to claim 12, wherein:
the comparator circuit compares a total summed current sourced from the first current summation node and a total summed current sourced from the second current summation node; and
the comparator circuit records values of the differential current signals sourced by the differential current circuit when the total summed current sourced from the first current summation node and the total summed current sourced from the second current summation node are equal.

15. The integrated circuit according to claim 14, wherein:
the integrated circuit converts the recorded values of the differential current signals sourced by the differential current circuit to a digital output.

16. The integrated circuit according to claim 12, wherein:
the differential current circuit sources a plurality of predetermined current signals to the first current summation node and the second current summation node based on a set of predetermined current signal values ranging from a most negative current value to a most positive current value.

17. The integrated circuit according to claim 9, wherein:
the first current source and the second current source of each of the plurality of paired current sources comprise a programmable current generator that is preprogrammed with a predetermined weight of a machine learning model.

18. The integrated circuit according to claim 9, wherein:
the first summation node is configured to sum positive current signals sourced from the first current source of each of the plurality of paired current sources; and
the second summation node is configured to sum negative current signals sourced from the second current source of each of the plurality of paired current sources.

19. A method of using an integrated circuit, the method comprising:
supplying a voltage input signal to a control terminal of each of a plurality of paired current sources;
in response to the voltage input signal, generating at each of the plurality of paired current sources two differential currents, wherein a value of a difference between the two differential currents generated by each of the plurality of paired current sources varies, and wherein each of the two differential currents of each of the plurality of paired current sources is sourced to one of a first summation node and a second summation node;

identifying an average voltage value of the first current summation node and the second current summation node;

in response to identifying the average voltage value of the first current summation node and the second current summation node, setting the average voltage value of the first current summation node and the second current summation node to a predetermined target voltage by generating two common current signals and sources a first common current signal and a second common current signal of the two common current signals to each of the first current summation node and the second current summation node, respectively, wherein a magnitude and a direction of the two common current signals are equal;

generating two predetermined differential current signals having a same magnitude and opposite directions;

sourcing a first differential current and a second differential current of the two predetermined differential currents to the first current summation node and the second current summation node, respectively;

comparing a total summed current sourced from the first current summation node and a total summed current sourced from the second current summation node; and outputting an indicator when the total summed current sourced from the first current summation node and the total summed current sourced from the second current summation node are equal.

* * * * *